(12) United States Patent
Lee et al.

(10) Patent No.: US 12,439,804 B2
(45) Date of Patent: Oct. 7, 2025

(54) DISPLAY DEVICE AND ELECTRONIC DEVICE HAVING THE SAME

(71) Applicant: Samsung Display Co., Ltd., Yongin-si (KR)

(72) Inventors: Jeongseok Lee, Yongin-si (KR); Seungwook Kwon, Hwaseong-si (KR); Sehoon Jeong, Suwon-si (KR); Woo Yong Sung, Seoul (KR); Seungyong Song, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 740 days.

(21) Appl. No.: 17/649,158

(22) Filed: Jan. 27, 2022

(65) Prior Publication Data

US 2022/0255034 A1    Aug. 11, 2022

(30) Foreign Application Priority Data

Feb. 8, 2021    (KR) .................. 10-2021-0017287

(51) Int. Cl.
*H10K 59/80*    (2023.01)
*H10K 50/84*    (2023.01)
(Continued)

(52) U.S. Cl.
CPC .......... *H10K 59/87* (2023.02); *H10K 50/841* (2023.02); *H10K 59/124* (2023.02);
(Continued)

(58) Field of Classification Search
CPC . H10K 59/87–872; H10K 59/873–874; H10K 59/875–879; H10K 50/84–841; H10K 50/85–858; G09F 9/301
See application file for complete search history.

(56) References Cited

U.S. PATENT DOCUMENTS 8,664,021 B2 *   3/2014   Kim .................. H10K 59/90
                                                          257/98
9,614,168 B2     4/2017   Zhang et al.
(Continued)

FOREIGN PATENT DOCUMENTS

CN           110392146 A     10/2019
KR       10-2017-0030314 A   3/2017
(Continued)

OTHER PUBLICATIONS

MTF—Modulation Transfer Function. Eckhardt Optics. (Aug. 14, 2020). https://web.archive.org/web/20200814074040/https://www.eckop.com/resources/optics/mtf-modulation-transfer-function/ (Year: 2020).*

(Continued)

*Primary Examiner* — Chad M Dicke
*Assistant Examiner* — Mario Andres Autore, Jr.
(74) *Attorney, Agent, or Firm* — Womble Bond Dickinson (US) LLP

(57) ABSTRACT

A display device includes: a window; a display panel comprising a first display area and a second display area having a pixel density less than that of the first display area, the display panel being under the window; a protective layer under the display panel; and a lower layer in which a first opening corresponding to the second display area is defined and which is under the protective layer, wherein a portion of the protective layer, which corresponds to the second display area, has a haze of 4% or less, a wavefront peak valley value of 0.05 or more and 2.00 or less, a wavefront root mean square value of 0.01 or more and 0.40 or less.

19 Claims, 17 Drawing Sheets

|  | #1 | #2 | #3 | #4 | #5 |
|---|---|---|---|---|---|
| Transmittance [film only, %] (@400~700nm) | 87.9 | 87.8 | 90.8 | 89.6 | 89.3 |
| Haze[%] | 3.7 | 1.1 | 0.12 | 0.09 | 4.44 |
| Wavefront[PV] | 1.5 | 0.25 | 1.41 | 0.71 | 4.39 |
| Wavefront[RMS] | 0.5 | 0.04 | 0.29 | 0.13 | 0.75 |
| Wavefront distortion | - | | | | |
| MTF (%,@110lp/mm) | 49.2 | 59.9 | 60.1 | 64.2 | 40 |

(51) Int. Cl.
  *H10K 59/12* (2023.01)
  *H10K 59/124* (2023.01)
  *H10K 59/35* (2023.01)
  *H10K 59/65* (2023.01)

(52) U.S. Cl.
  CPC .......... *H10K 59/871* (2023.02); *H10K 59/12* (2023.02); *H10K 59/351* (2023.02); *H10K 59/352* (2023.02); *H10K 59/65* (2023.02); *H10K 59/875* (2023.02)

(56) References Cited

U.S. PATENT DOCUMENTS

| | | | |
|---|---|---|---|
| 10,338,644 B2 | 7/2019 | Jung et al. | |
| 10,474,282 B2* | 11/2019 | Park | G06F 3/0416 |
| 10,541,380 B1* | 1/2020 | Sung | H10K 50/844 |
| 11,038,143 B2* | 6/2021 | Moon | H10K 59/40 |
| 2001/0015853 A1* | 8/2001 | Kittaka | G02B 3/0037 |
| | | | 359/623 |
| 2003/0077437 A1* | 4/2003 | Nakamura | G02B 1/12 |
| | | | 264/2.7 |
| 2014/0240289 A1* | 8/2014 | Myers | G06F 3/0412 |
| | | | 345/174 |
| 2017/0153668 A1* | 6/2017 | Jang | G06F 1/1641 |
| 2019/0004294 A1* | 1/2019 | Baba | G02B 13/04 |
| 2019/0081274 A1* | 3/2019 | Choi | H10K 59/122 |
| 2019/0103572 A1* | 4/2019 | Park | H10K 50/86 |
| 2019/0243041 A1* | 8/2019 | Takarada | C09J 133/10 |
| 2020/0120815 A1* | 4/2020 | Jin | H10K 50/841 |
| 2020/0212130 A1* | 7/2020 | Kim | H10K 59/878 |
| 2020/0235187 A1 | 7/2020 | Bae et al. | |
| 2021/0028252 A1* | 1/2021 | Hong | H10K 59/126 |
| 2021/0135151 A1* | 5/2021 | Baek | G06F 3/046 |
| 2022/0274376 A1* | 9/2022 | Tabata | G09F 9/00 |
| 2023/0263023 A1* | 8/2023 | Lee | H10K 59/131 |
| | | | 257/773 |

FOREIGN PATENT DOCUMENTS

| | | |
|---|---|---|
| KR | 10-2017-0063344 A | 6/2017 |
| KR | 10-2019-0028617 A | 3/2019 |
| KR | 10-2019-0037604 A | 4/2019 |
| KR | 10-2019-0091711 A | 8/2019 |
| KR | 10-2021-0013500 A | 2/2021 |

OTHER PUBLICATIONS

MTF—Modulation Transfer Function. Eckhardt Optics. (Aug. 14, 2020). httos:/Aweb.archive.org/web/20200814074040/https://www.eckop.com/resources/optics/mtf-modulation-transfer-function/ (Year: 2020).*

EPO Extended European Search Report dated Jul. 11, 2022, issued in corresponding European Patent Application No. 22155618.6, 8 pages.

* cited by examiner

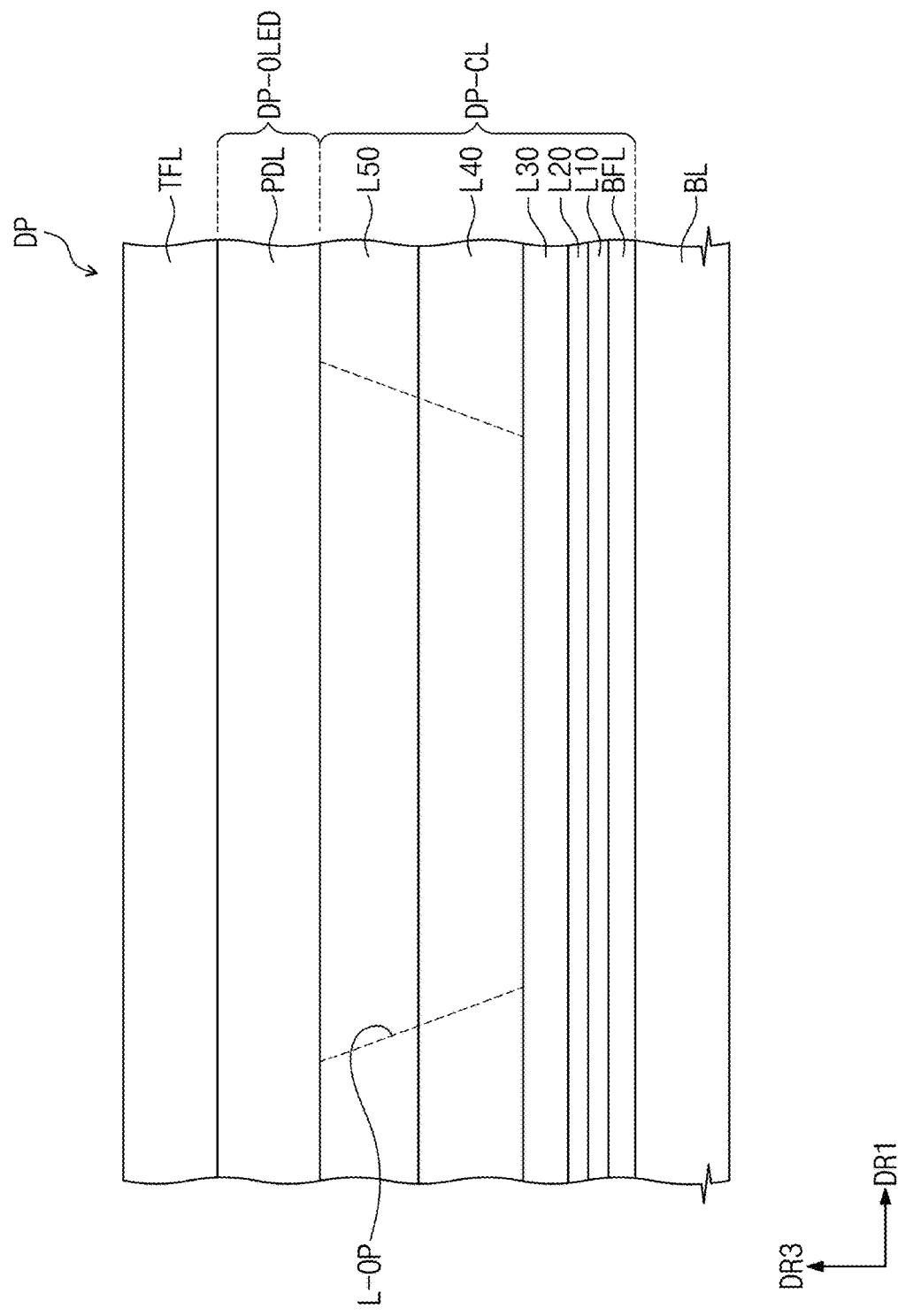

| | #1 | #2 | #3 | #4 | #5 |
|---|---|---|---|---|---|
| Transmittance [film only, %] (@400~700nm) | 87.9 | 87.8 | 90.8 | 89.6 | 89.3 |
| Haze[%] | 3.7 | 1.1 | 0.12 | 0.09 | 4.44 |
| Wavefront[PV] | 1.5 | 0.25 | 1.41 | 0.71 | 4.39 |
| Wavefront[RMS] | 0.5 | 0.04 | 0.29 | 0.13 | 0.75 |
| Wavefront distortion | - |  |  |  |  |
| MTF (%,@110lp/mm) | 49.2 | 59.9 | 60.1 | 64.2 | 40 |

DISPLAY DEVICE AND ELECTRONIC DEVICE HAVING THE SAME

CROSS-REFERENCE TO RELATED APPLICATION

The present application claims priority to and the benefit of Korean Patent Application No. 10-2021-0017287, filed on Feb. 8, 2021, the entire content of which is hereby incorporated by reference.

BACKGROUND

Aspects of some embodiments of the present disclosure herein relate to a display device, and for example, to a display device including a display area through which an optical signal moves, and an electronic device including the same.

Portable electronic devices have become ubiquitous in modern society, and their functions are becoming more and more diverse. Users, however, may prefer electronic devices that have relatively wider display areas and relatively narrower non-display areas.

Various types of electronic devices have been developed to reduce a surface area of the non-display area.

The above information disclosed in this Background section is only for enhancement of understanding of the background and therefore the information discussed in this Background section does not necessarily constitute prior art.

SUMMARY

Aspects of some embodiments of the present disclosure include a display device having a relatively wide display area and a relatively narrow non-display area.

Aspects of some embodiments of the present disclosure may further include a display device capable of photographing a clear picture.

According to some embodiments of the inventive concept, a display device includes: a window; a display panel including a first display area and a second display area having a pixel density less than that of the first display area, the display panel being under the window; a protective layer under the display panel; and a lower layer in which a first opening corresponding to the second display area is defined and which is under the protective layer. According to some embodiments, a portion of the protective layer, which corresponds to the second display area, may have a haze of about 4% or less, a wavefront peak valley value of about 0.05 or more and about 2.00 or less, a wavefront root mean square value of about 0.01 or more and about 0.40 or less.

According to some embodiments, the protective layer may include a synthetic resin film and an adhesive layer between the synthetic resin film and the display panel.

According to some embodiments, the synthetic resin film may commonly overlap the first display area and the second display area.

According to some embodiments, the protective layer may include a synthetic resin layer that is directly on a bottom surface of the display panel.

According to some embodiments, the synthetic resin layer may commonly overlap the first display area and the second display area.

According to some embodiments, the protective layer may include: a synthetic resin film having a second opening which corresponds to the second display area; and a synthetic resin layer inside the second opening.

According to some embodiments, the protective layer may include polyethylene terephthalate, polyurethane, or polyethylene.

According to some embodiments, a light emitting element on the first display area may have a density greater than that on the second display area.

According to some embodiments, the lower layer may include a metal plate.

According to some embodiments, the first display area may include a plurality of first unit pixel areas.

According to some embodiments, the second display area may include a plurality of second unit pixel areas and a plurality of non-unit pixel areas.

According to some embodiments, the plurality of second unit pixel areas may include an insulating layer overlapping the second display area and a light emitting element on the insulating layer.

According to some embodiments, each of the plurality of non-unit pixel areas may include an opening defined in the insulating layer.

According to some embodiments, each of the plurality of first unit pixel areas and the plurality of second unit pixel areas may include at least three emission areas According to some embodiments, each of the non-unit pixel areas may have a surface area greater than the sum of surface areas of at least two emission areas of the three emission areas.

According to some embodiments, a modulation transfer function value of an image of a subject outside the window, which is photographed by a camera module that is under the lower layer to correspond to the first opening may be about 60% or more.

According to some embodiments of the inventive concept, a display device includes: a window; a display panel including a first display area and a second display area having a pixel density less than that of the first display area, the display panel being under the window; a protective layer under the display panel; and a lower layer in which a first opening corresponding to the second display area is defined and which is under the protective layer. According to some embodiments, the protective layer may include: a synthetic resin film corresponding to the first display area and in which a second opening corresponding to the second display area is defined; and a synthetic resin layer inside the second opening. According to some embodiments, the synthetic resin layer may have an elastic modulus less than that of the synthetic resin film. According to some embodiments, the synthetic resin layer may have a haze less than that of the synthetic resin film.

According to some embodiments, the synthetic resin layer may have a haze of about 4% or less.

According to some embodiments, the synthetic resin layer may have a wavefront peak valley value of about 0.05 or more and about 2.00 or less.

According to some embodiments, the synthetic resin layer may have a wavefront root mean square value of about 0.01 or more and about 0.40 or less.

According to some embodiments, a modulation transfer function value of an image of a subject outside the window, which is photographed by a camera module that is under the lower layer to correspond to the first opening may be about 60% or more.

According to some embodiments, an adhesive layer may be between the synthetic resin film and a bottom surface of the display panel, and the synthetic resin layer may be directly on the bottom surface of the display panel.

According to some embodiments, a third opening corresponding to the second opening may be defined in the adhesive layer.

According to some embodiments of the inventive concept, an electronic device includes: a display device including a first display area and a second display area having a pixel density less than that of the first display area; a camera module under the display device to correspond to the second display area; and a housing coupled to the display device to accommodate the camera module. According to some embodiments, a modulation transfer function value of an image of a subject outside the display device, which is photographed by the camera module may be about 60% or more at a frequency of about 110 LP/mm, and the protective layer in a path along which light reflected from the subject is incident into the camera module may have a haze of about 4% or less.

BRIEF DESCRIPTION OF THE FIGURES

The accompanying drawings are included to provide a further understanding of the inventive concept, and are incorporated in and constitute a part of this specification. The drawings illustrate aspects of some embodiments of the inventive concept and, together with the description, serve to explain characteristics of some embodiments of the inventive concept. In the drawings:

FIGS. 5D and 5E are cross-sectional views of the display panel according to some embodiments of the inventive concept;

DETAILED DESCRIPTION

Figure 1:
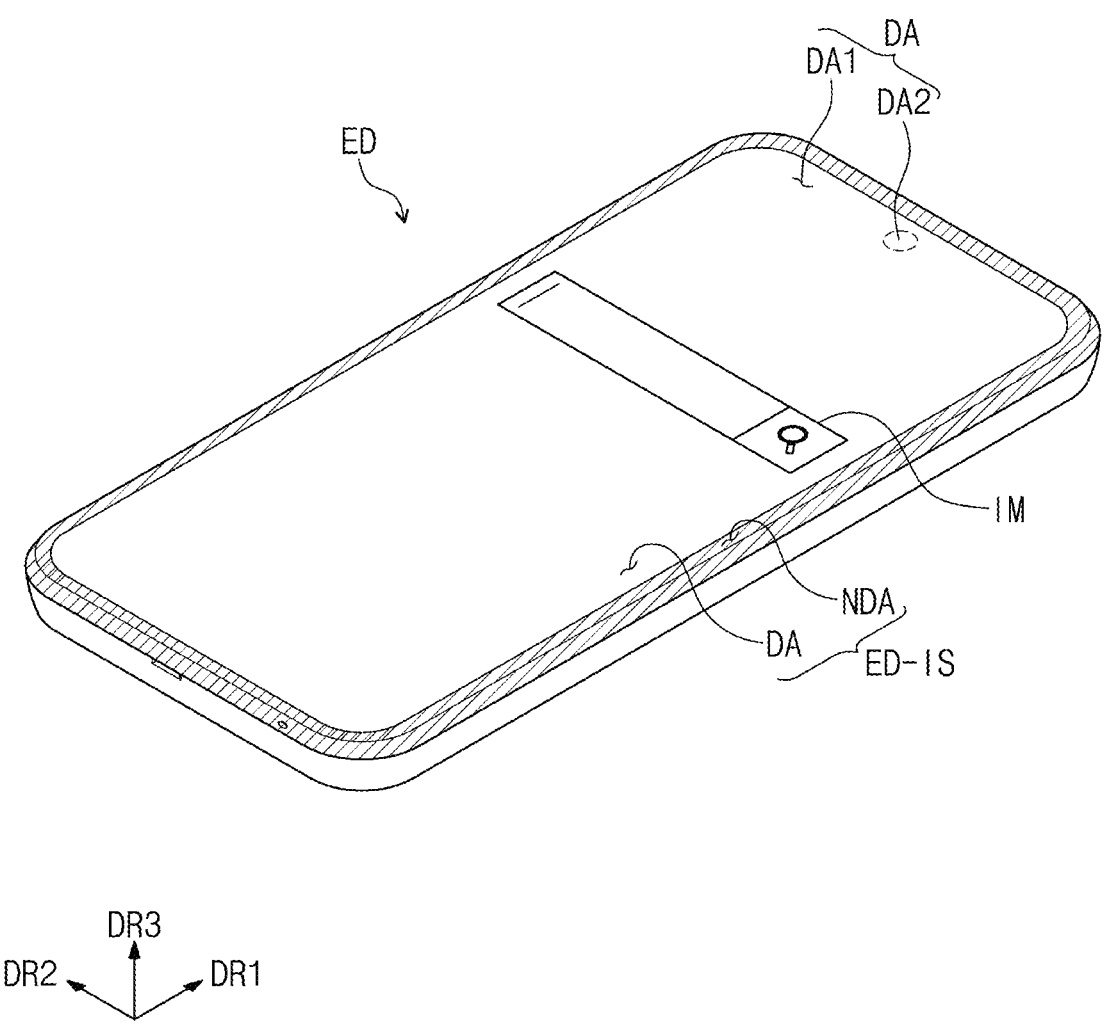
FIG. 1 is a perspective view of an electronic device according to some embodiments of the inventive concept.

In this specification, it will also be understood that when one component (or area, layer, portion) is referred to as being 'on', 'connected to', or 'coupled to' another component, it can be directly located/connected/coupled on/to the one component, or an intervening third component may also be present.

Like reference numerals refer to like elements throughout. Also, in the figures, the thickness, ratio, and dimensions of components are exaggerated for clarity of illustration. The term "and/or" includes any and all combinations of one or more of the associated elements.

It will be understood that although the terms such as 'first' and 'second' are used herein to describe various elements, these elements should not be limited by these terms. The terms are only used to distinguish one component from other components. For example, a first element referred to as a first element according to some embodiments can be referred to as a second element in other embodiments without departing from the spirit and scope of embodiments according to the present disclosure as defined in the appended claims. The terms of a singular form may include plural forms unless referred to the contrary.

Also, "under", "below", "above", "upper", and the like are used for explaining relation association of the elements illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

Unless otherwise defined, all terms (including technical and scientific terms) used herein have the same meaning as commonly understood by a person of ordinary skill in the art to which this invention belongs. In addition, terms such as terms defined in commonly used dictionaries should be interpreted as having a meaning consistent with the meaning in the context of the related technology, and unless explicitly defined here, they are interpreted as too ideal or too formal sense.

Hereinafter, embodiments of the inventive concept will be described with reference to the accompanying drawings.

Figure 2:
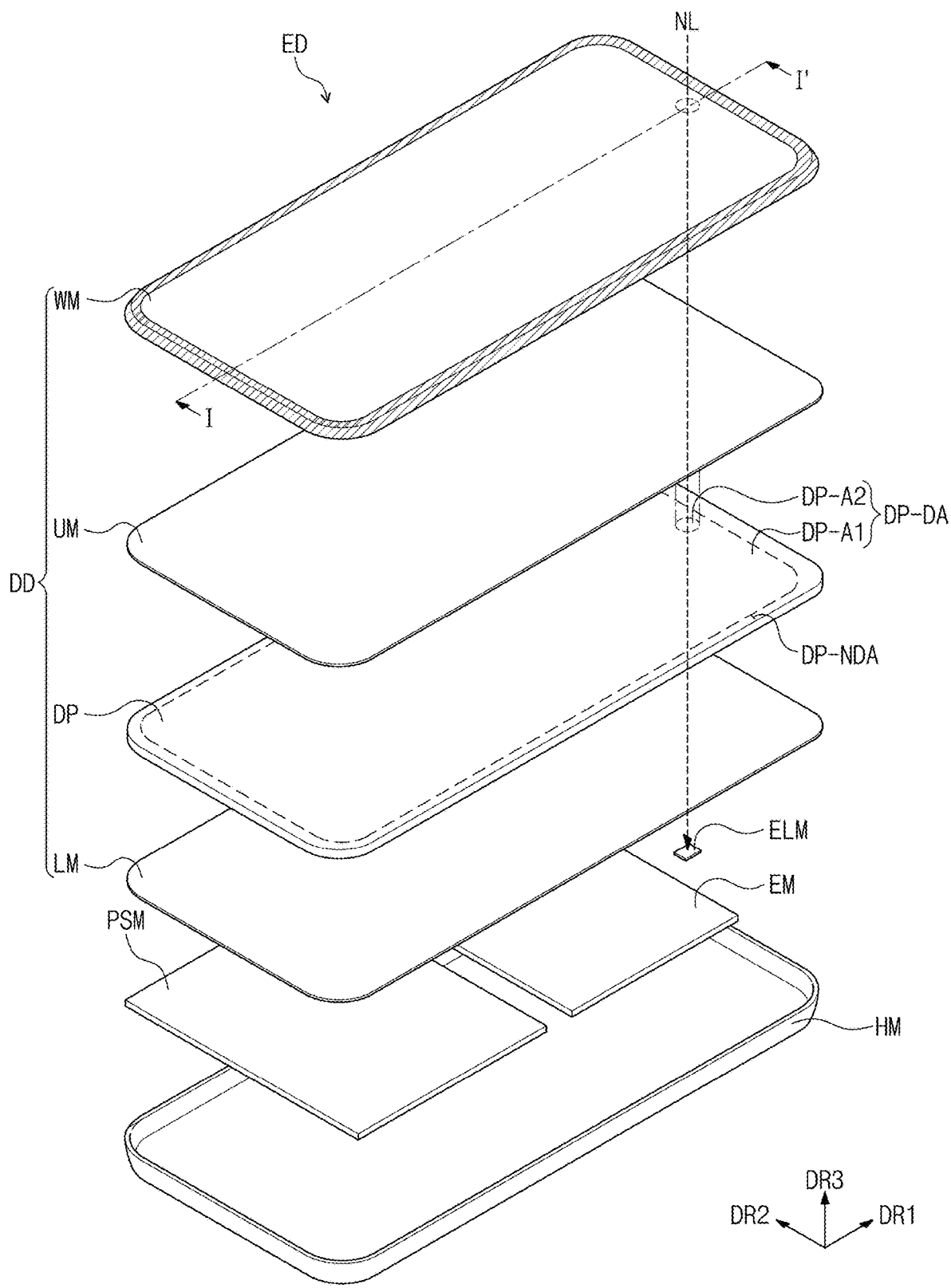
FIG. 2 is an exploded perspective view of the electronic device according to some embodiments of the inventive concept.
Figure 3:
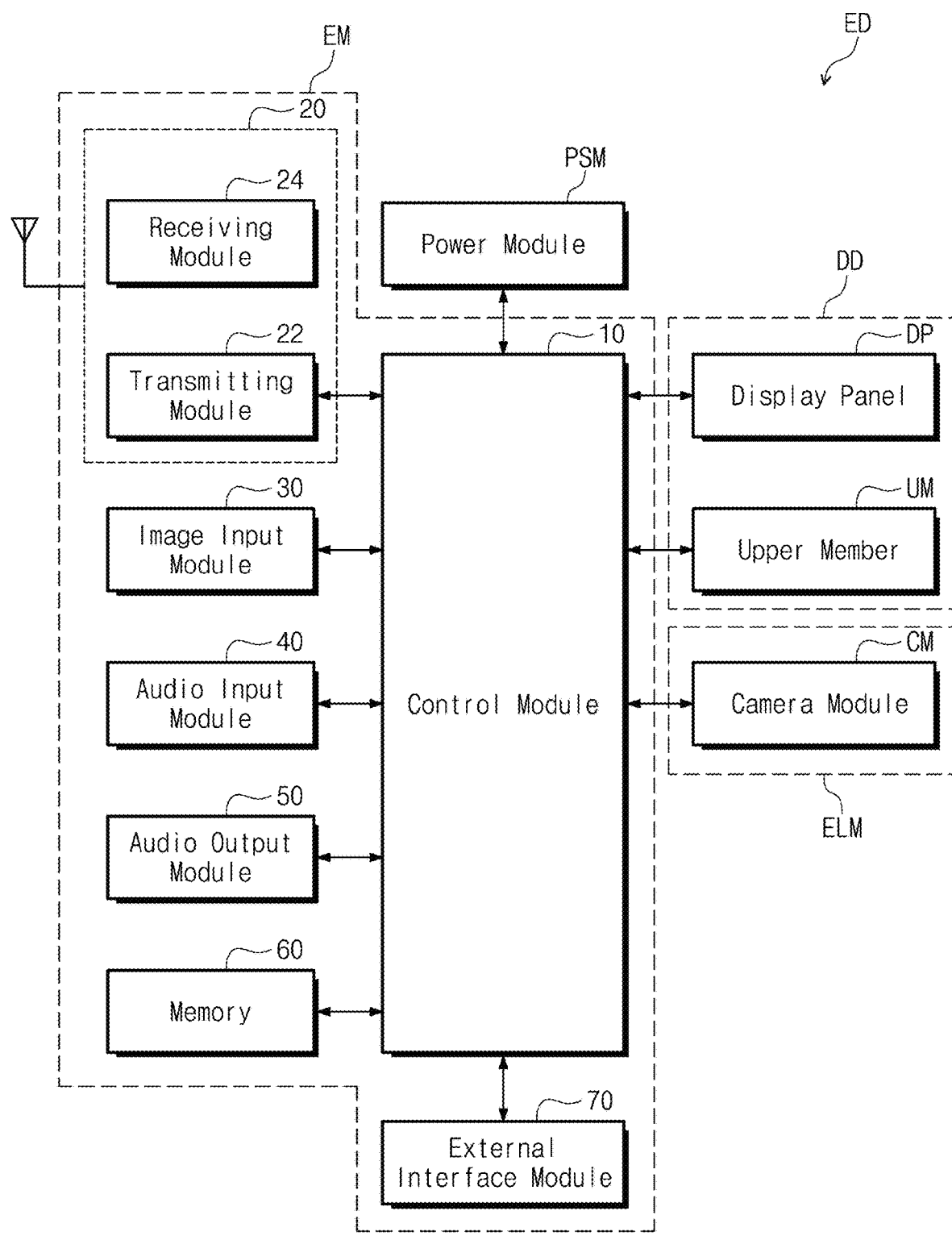
FIG. 3 is a block diagram of the electronic device according to some embodiments of the inventive concept.

FIG. 1 is a perspective view of an electronic device ED according to some embodiments of the inventive concept. FIG. 2 is an exploded perspective view of the electronic device ED according to some embodiments of the inventive concept. FIG. 3 is a block diagram of the electronic device ED according to some embodiments of the inventive concept.

Referring to FIG. 1, the display device ED may display an image (or a plurality of images, such as static or video images) IM through a display surface ED-IS. The display surface ED-IS is parallel to a surface defined by a first directional axis DR1 and a second directional axis DR2. A normal direction of the display surface ED-IS, i.e., a thickness direction of the electronic device ED, or a direction perpendicular to the display surface ED-IS, is indicated by a third directional axis DR3. The display surface ED-IS of the electronic device ED may correspond to a front surface of the electronic device ED and may correspond to a top surface of a window WM.

A front surface (or a top surface) and a rear surface (or a bottom surface) of each of members or units, which will be described in more detail below, are distinguished by the third directional axis DR3. However, the first to third directional axes illustrated in FIG. 1 are merely examples. Hereinafter, first to third directions may be directions indicated by the first to third directional axes DR1, DR2, and DR3 and designated by the same reference numerals, respectively.

The display surface ED-IS may include a display area DA and a non-display area NDA adjacent to (or outside a footprint of) the display area DA. The non-display area NDA may be an area at which images are not displayed (e.g., a bezel area). The display area NDA may include a first display area DA1 and a second display area DA2. The second display area DA2 is an area having a pixel density less than that of the first display area DA1 and also is an area through which optical signals may pass or propagate. Although one second display area DA2 is illustrated as an example, a large number of second display areas DA2 may be formed or arranged in the display area DA. Here, the optical signal may be external natural light or an optical signal generated by a light emitting element installed inside the electronic device ED, for example, infrared rays, or an optical signal emitted by an external device to the electronic device ED. A kind of optical signal is not particularly limited. A further detailed description of the second display area DA2 will be described in more detail later.

The non-display area NDA may be an area that blocks the optical signal and may be an area arranged outside (e.g., outside a footprint of) the display area DA on a plane to surround the display area DA. According to some embodiments of the inventive concept, the non-display area NDA may not be arranged on the front surface of the electronic device ED, but may instead be arranged on a side surface of the electronic device ED. According to some embodiments, the non-display area NDA may be omitted.

According to some embodiments, the second display area DA2 may be surrounded by the first display area DA1. According to some embodiments, the second display area DA2 is illustrated to be spaced apart from the non-display area NDA, but according to some embodiments, the second display area DA2 may extend from the non-display area NDA.

According to some embodiments, a flat display surface ED-IS is illustrated as an example. However, according to some embodiments of the inventive concept, curved areas may be arranged on both sides of the display surface ED-IS, which face each other in the second direction DR2.

According to some embodiments, a mobile phone is illustrated as an example, but the electronic device according to the inventive concept is not limited thereto and may be modified and implemented into various information providing devices such as a television, a navigation system, a computer monitor, and a game console.

As illustrated in FIGS. 2 and 3, the electronic device ED may include a display device DD, an electronic module EM, an electro-optical module ELM, a power module PSM, and a housing HM.

The display device DD generates an image. The display device DD includes a display panel DP, an upper member UM, a lower member LM, and a window WM. The display panel DP includes a first display area DP-A1, a second display area DP-A2, and a non-display area DP-NDA, which correspond to the first display area DA1, the second display area DA2, and the non-display area NDA of the electronic device ED.

The display panel DP is not particularly limited, and may be, for example, an emission type display panel such as an organic light emitting display panel or an inorganic light emitting display panel.

The display device DD may sense an external input and/or an external pressure according to a configuration of the upper member UM. The upper member UM may include various members.

According to some embodiments, the upper member UM may include an optical film and an input sensing sensor. The optical film reduces reflectance of external light. The optical film may include a polarizer and a retarder. The polarizer and the retarder may be a stretch type or coating type. In the coating type optical film, an optical axis is defined according to the stretching direction of the functional film. The coating type optical film may include liquid crystal molecules arranged on the base film.

The input sensing sensor senses a user's external input. The input sensing sensor may sense an external input through a capacitive method, a pressure sensing method, or an electromagnetic induction method.

The lower member LM may include various members. According to some embodiments, the lower member LM may include a protective layer PPL, a barrier layer BRL, a metal plate MPL, and a cushion layer CSL.

The window WM provides an outer surface of the electronic device ED. The window WM includes a base substrate and may further include functional layers such as an anti-reflection layer and an anti-fingerprint layer.

According to some embodiments, the display device DD may include at least one adhesive layer. The adhesive layer may couple the window WM to the upper member UM, couple the upper member UM to the display panel DP, or couple the lower member LM to the display panel DP. The adhesive layer may couple components of the upper member UM and the lower member LM to each other. The adhesive layer may be an optically transparent adhesive layer or a pressure sensitive adhesive layer.

The electronic module EM may include a control module 10, a wireless communication module 20, an image input module 30, an audio input module 40, an audio output module 50, a memory 60, and an external interface module 70. The modules may be mounted on the circuit board or may be electrically connected to each other through the flexible circuit board. The electronic module EM is electrically connected to the power module PSM.

The control module 10 controls an overall operation of the electronic device ED. For example, the control module 10 activates or inactivates the display device DD according to a user input. The control module 10 may control the image input module 30, the audio input module 40, the audio output module 50, and the like in accordance with the user input. The control module 10 may include at least one microprocessor.

The wireless communication module 20 may transmit/receive a wireless signal to/from the other terminal by using Bluetooth or Wi-Fi. The wireless communication module 20 may transmit/receive a voice signal by using a general communication line. The wireless communication module 20 includes a transmitting circuit 22 modulating and transmitting a signal to be transmitted and a receiving circuit 24 demodulating the received signal.

The image input module 30 processes an image signal to convert the processed image signal into image data that is capable of being displayed on the display device DD. The audio input module 40 receives an external audio signal by using a microphone in a recording mode or a voice recognition mode to convert the received audio signal into electrical sound data. The audio output module 50 converts the audio data received from the wireless communication module 20 or the audio data stored in the memory 60 to output the converted audio data to the outside.

The external interface module 70 serves as an interface connected to an external charger, a wired/wireless data port, and a card socket (for example, a memory card and an SIM/UIM card).

The power module PSM supplies power necessary for the overall operation of the electronic device ED. The power module PSM may include a typical battery device.

The housing HM illustrated in FIG. 2 is coupled to the display device DD, for example, the window WM to accommodate the other modules. In FIG. 2, the housing HM provided as one member is illustrated as an example. However, the housing HM may include two or more components that are assembled together with each other.

The electro-optical module ELM may be an electronic component that outputs or receives an optical signal. The electro-optical module ELM transmits or receives the optical signal through a partial area of the display device DD corresponding to the second display area DP-A2. According to some embodiments, the electro-optical module ELM may include a camera module CM. The camera module CM receives natural light NL through the second display area DP-A2 to photograph an external image. The electro-optical module ELM may further include a proximity sensor or an infrared emission sensor.

The electro-optical module ELM is arranged under the display device DD. The electro-optical module ELM overlaps the second display area DP-A2 of the display device DD. The second display area DP-A2 of the display device DD has light transmittance greater than that of each of other areas of the display device DD. Hereinafter, the display device DD will be described in more detail.

Figure 4:
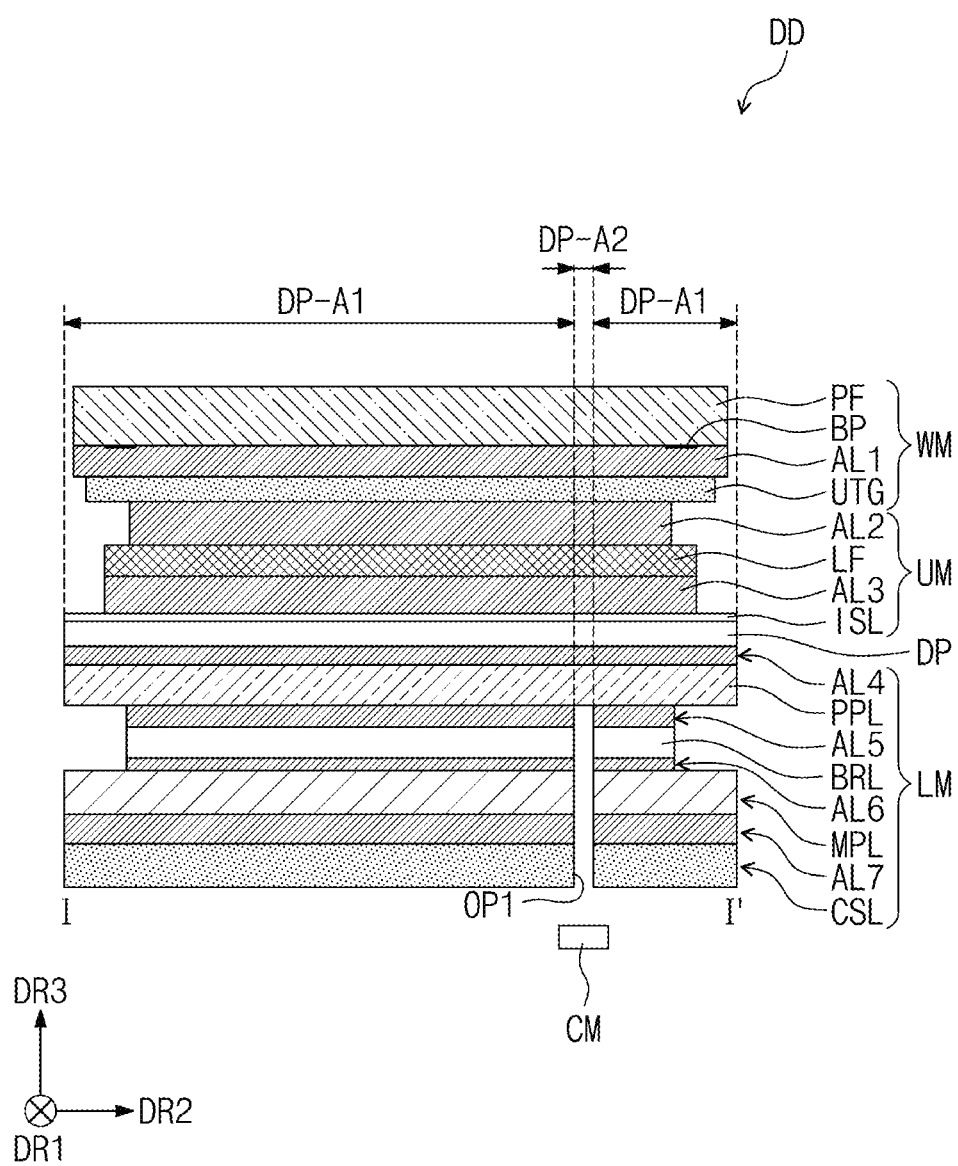
FIG. 4 is a cross-sectional view of a display device according to some embodiments of the inventive concept.

FIG. 4 is a cross-sectional view of the display device DD according to some embodiments of the inventive concept. Hereinafter, detailed descriptions with respect to the same constituent as that described with reference to FIGS. 1 to 3 will be omitted.

The display device DD includes the window WM, the upper member UM, the display panel DP, and the lower member UM.

The window WM may include a thin-film glass substrate UTG, a window protective layer PF arranged on the thin-film glass substrate UTG, and a bezel pattern BP arranged on a bottom surface of the window protective layer PF. According to some embodiments, the window protective layer PF may include a plastic film. Accordingly, the window WM may further include an adhesive layer AL1 (hereinafter, referred to as a first adhesive layer) bonding the plastic film PF to the thin glass substrate UTG.

The upper member UM may include an optical film LF and an input sensor IS, which are arranged on the display panel DP. According to some embodiments, the input sensor IS is illustrated as being directly arranged on the display panel DP as an example, but an adhesive layer may be further arranged between the display panel DP and the input sensor ISL.

The lower member LM may include the protective layer PPL, the barrier layer BRL, the metal plate MPL, and the cushion layer CSL, which are arranged under the display panel DP. The display device DD may further include an adhesive layer that bonds the adjacent members among the above-described members. Second to seventh adhesive layers AL2 to AL7 are illustrated as an example in FIG. 4. The second to seventh adhesive layers AL5 to AL7 may include a transparent adhesive such as a pressure-sensitive adhesive or an optically transparent adhesive. Some of the above-described constituents according to some embodiments of the inventive concept may be omitted. For example, the metal plate MPL and the seventh adhesive layer AL7 associated with the metal plate MP may be omitted.

According to some embodiments of the inventive concept, the third adhesive layer AL3 attaching the optical film LF to the input sensor IS may be omitted. According to some embodiments, the optical film LF may be arranged directly on the input sensor ISL. The optical film LF may be substituted for coated liquid crystal molecules or color filters.

The protective layer PPL may be arranged under the display panel DP. The passivation layer PPL may commonly overlap the first display area DP-A1 and the second display area DP-A2. The protective layer PPL may protect a lower portion of the display panel DP from a physical impact. For example, the protective layer PPL may include polyethylene terephthalate, polyurethane, or polyethylene.

According to some embodiments, the fourth adhesive layer AL4 allows the protective layer PPL and the display panel DP to adhere to each other. However, according to some embodiments of the inventive concept, the partial or entire area of the fourth adhesive layer AL4 may be omitted. Although a bottom surface of the display panel and a synthetic resin film are bonded to each other through the fourth adhesive layer AL4, if the synthetic resin layer is directly arranged on the bottom surface of the display panel DP, the entire fourth adhesive layer AL4 may be omitted.

The fifth adhesive layer AL5 bonds the protective layer PPL to the barrier layer BRL. The barrier layer BRL may be arranged under the protective layer PPL. The barrier layer BRL may improve resistance to compressive force due to external pressing. Thus, the barrier layer BRL may prevent the display panel DP from being deformed. The barrier layer BRL may include a flexible plastic material such as polyimide or polyethylene terephthalate.

Also, the barrier layer BRL may be a colored film having low light transmittance. The barrier layer BRL may absorb light incident from the outside. For example, the barrier layer BRL may be a black plastic film. When viewing the display device DD from an upper side of the window WM, the components arranged under the barrier layer BRL may not be visually recognized by the user.

The sixth adhesive layer AL6 bonds the barrier layer BRL to the metal plate MPL. The metal plate MPL is arranged under the barrier layer BRL. The metal plate MPL supports the components arranged thereon. The metal plate MPL may improve heat dissipation.

The seventh adhesive layer AL7 bonds the cushion layer CSL to the metal plate MPL. The cushion layer CSL may have an elastic modulus less than that of the metal plate MPL. For example, the cushion layer CSL may include thermoplastic polyurethane, rubber, silicon, but is not limited thereto. The cushion layer CSL may absorb an external impact.

The second display area DP-A2 of the display panel DP may be an area having a resolution less than that of the first display area DP-A1. The second display area DP-A2 of the display panel DP may be an area having transmittance greater than that of the first display area DP-A1.

An opening (hereinafter, referred to as a first opening) is defined in the members AL5 to CSL (hereinafter, referred to as lower layers) arranged under the protective layer PPL to correspond to the second display area DP-A2. According to some embodiments, the lower layers AL5 to CSL include a laminate structure from the fifth adhesive layer AL5 to the cushion layer CSL, but the structure of the laminate structure is not particularly limited. The external natural light may be incident into an area of the window WM, which corresponds to the second display area DP-A2 to pass through the second display area DP-A2 of the display panel DP and then be provided to the camera module CM through the first opening OP1. The above-described path corresponds to an incident path of the external light.

The upper member UM, the display panel DP, and the protective layer PPL arranged in the incident path may reduce transmittance of the external light and disperse the external light. In comparison, the first opening OP1 improves the transmittance of the external light and reduce the dispersion of the external light.

Figure 5A:
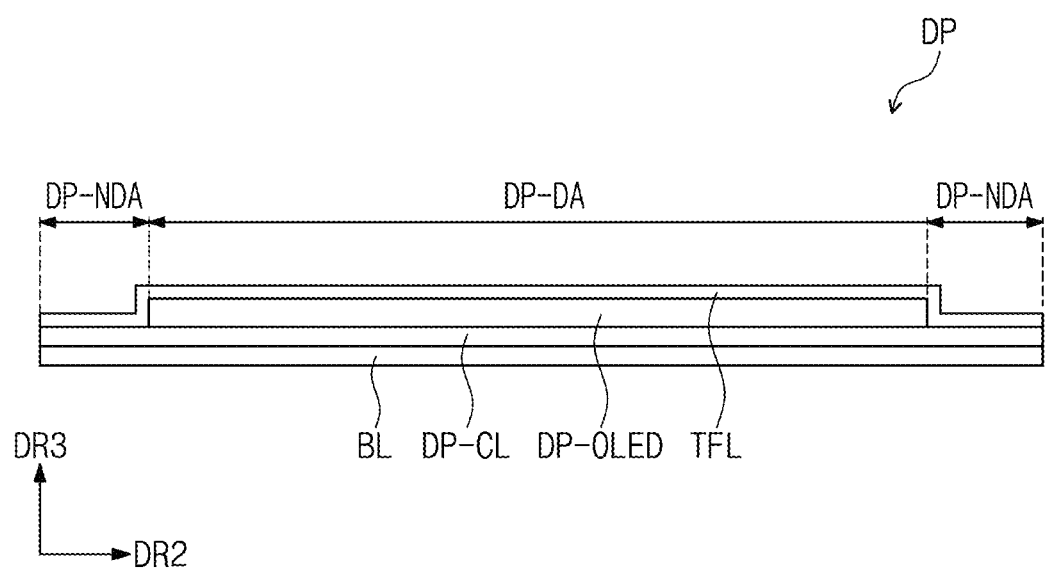
FIG. 5A is a cross-sectional view of a display panel according to some embodiments of the inventive concept.
Figure 5B:
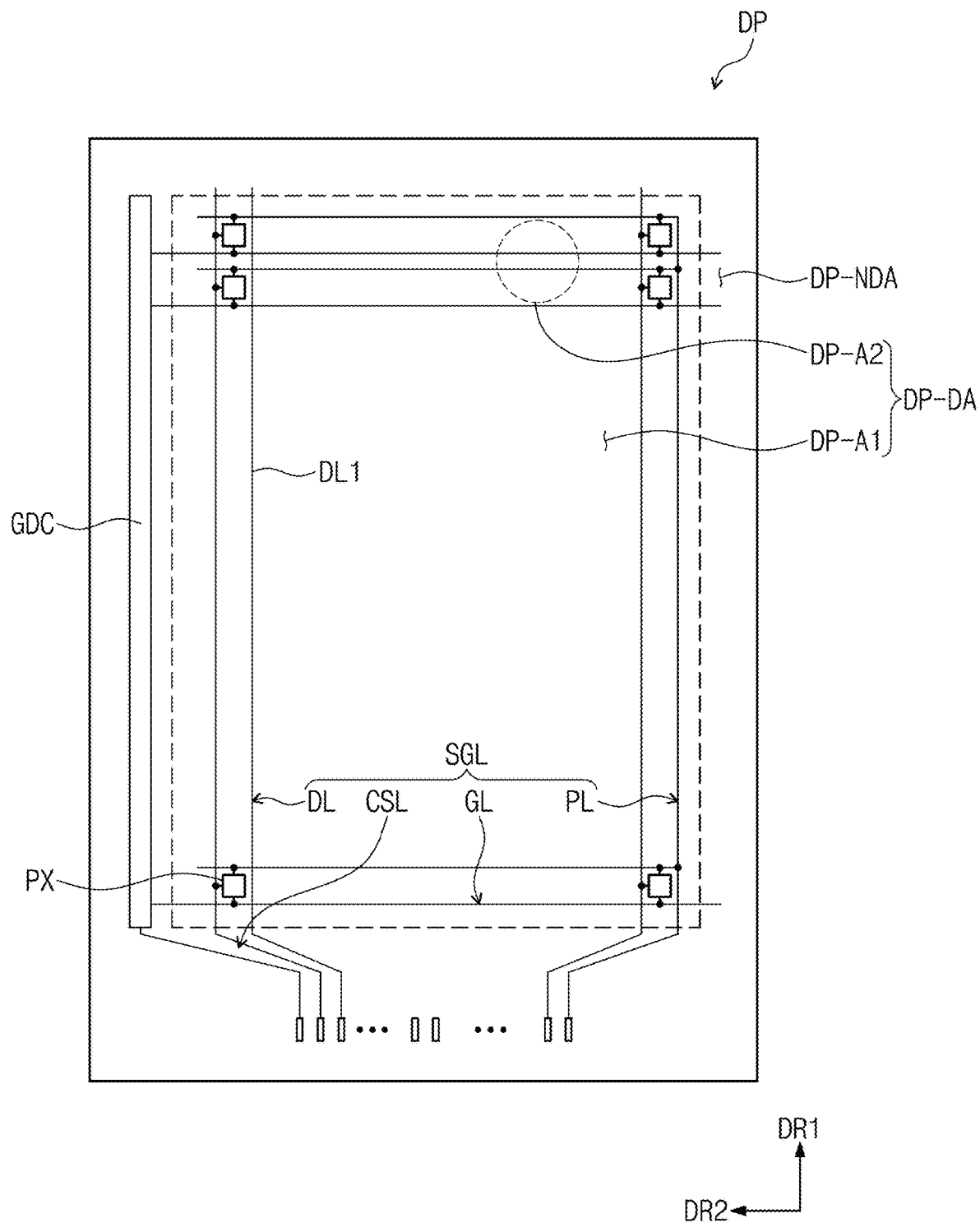
FIG. 5B is a plan view of the display panel according to some embodiments of the inventive concept.
Figure 5C:
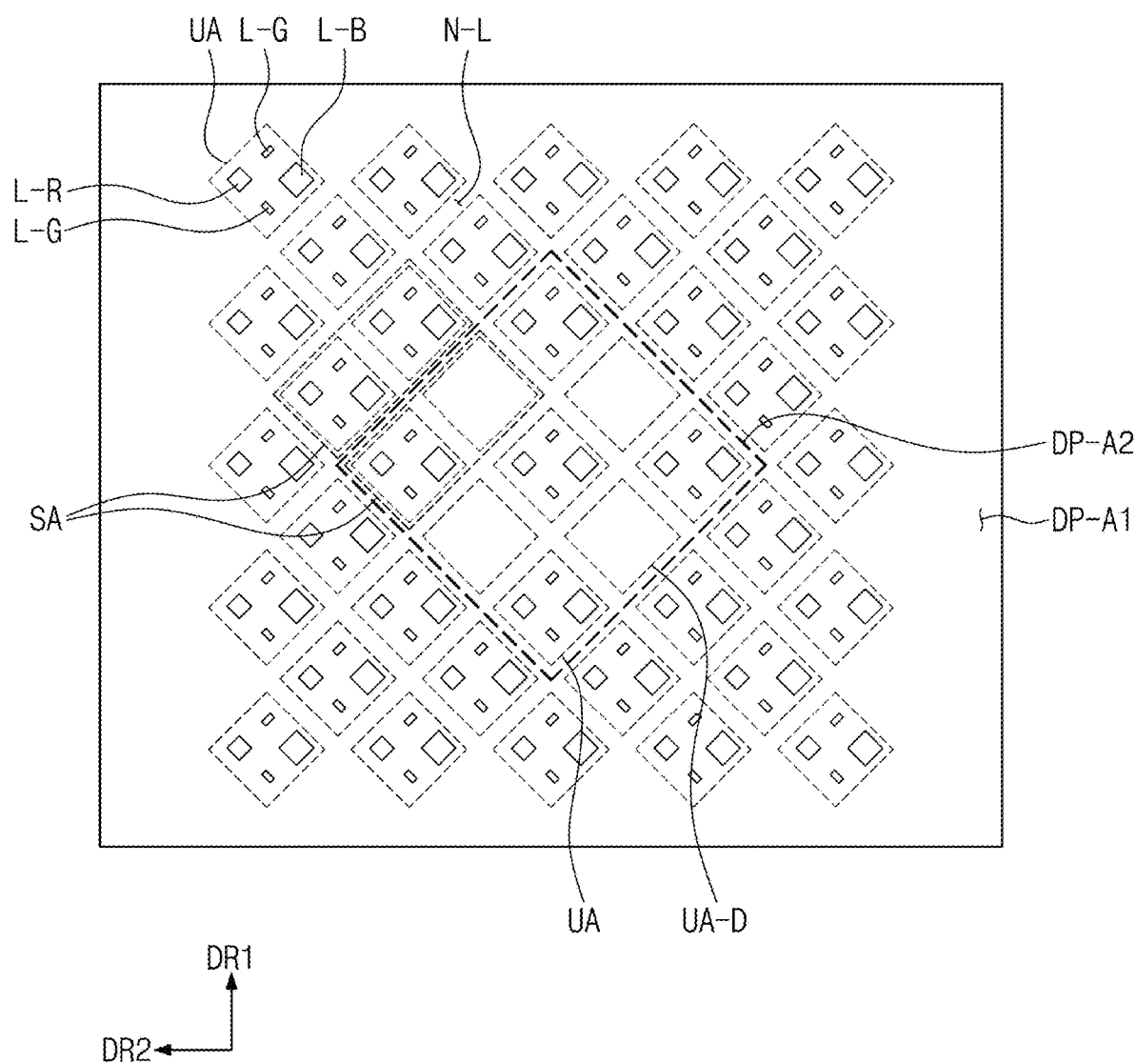
FIG. 5C is an enlarged plan view of the display panel according to some embodiments of the inventive concept.
Figure 5D:
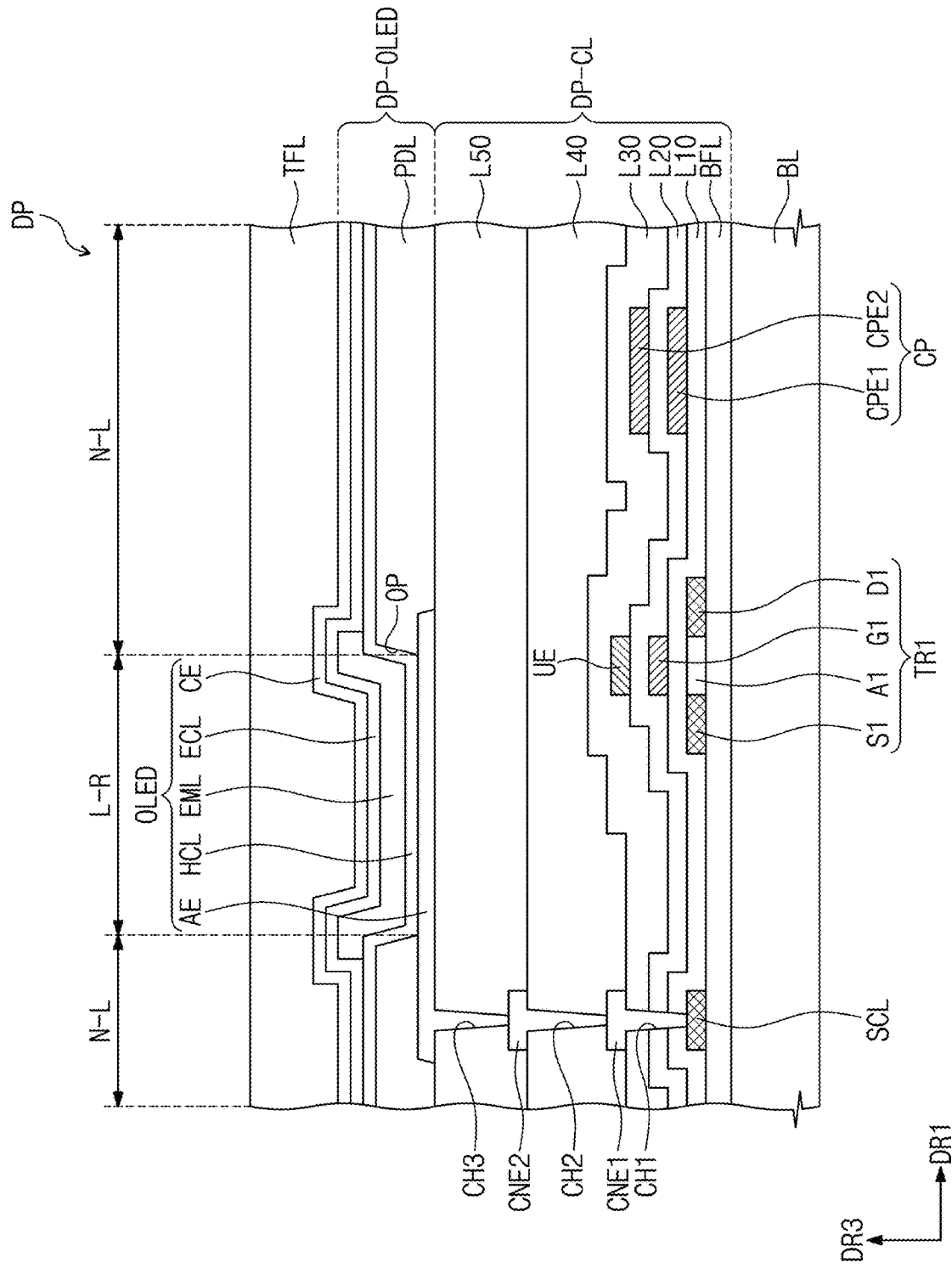

FIG. 5A is a cross-sectional view of the display panel DP according to some embodiments of the inventive concept. FIG. 5B is a plan view of the display panel DP according to some embodiments of the inventive concept. FIG. 5C is an enlarged plan view of the display panel DP according to some embodiments of the inventive concept. FIGS. 5D and 5E are cross-sectional views of the display panel DP according to some embodiments of the inventive concept.

As illustrated in FIG. 5A, the display panel DP may include a base layer BL, a circuit element layer DP-CL arranged on the base layer BL, a display element layer DP-OLED, and an upper insulation layer TFL. The base layer BL may include a plastic substrate, a glass substrate, a metal substrate, and an organic/inorganic composite substrate. The base layer BL may include at least one polyimide layer.

The circuit element layer DP-CL includes at least one insulating layer, semiconductor patterns, and conductive patterns. The insulating layer includes at least one inorganic layer and at least one organic layer. The semiconductor patterns and the conductive patterns may constitute signal lines, a pixel driving circuit, and a scan driving circuit. This will be described later in more detail.

The display element layer DP-OLED may include a display element, for example, an organic light emitting diode. The display element layer DP-OLED may further include an organic layer such as a pixel defining layer.

The upper insulating layer TFL may include a plurality of thin films. One portion of the thin films may be formed to improve optical efficiency, and the portion of the thin film may be formed to protect the organic light emitting diodes. The upper insulating layer TFL may include a thin film encapsulation layer including a laminate structure of an inorganic layer/organic layer/inorganic layer.

As illustrated in FIG. 5B, the display panel DP may include a plurality of signal lines SGL (hereinafter, referred to as signal lines), a plurality of pixels PX (hereinafter, referred to as pixels), and a driving circuit GDC. The pixels PX are arranged on the display area DP-DA. Each of the pixels PX includes an organic light emitting diode and a pixel driving circuit connected to the organic light emitting diode. The signal lines SGL and the pixel driving circuit may be included in the circuit element layer DP-CL illustrated in FIG. 5A.

The second display area DP-A2 has a pixel density less than that of the first display area DP-A1. On the basis of the same area, a smaller number of pixels PX than the first display area DP-A1 are arranged on the second display area DP-A2. The area on which the pixels PX are not arranged corresponds to a transmission area of the optical signal.

The pixels PX are not arranged on the non-display area DP-NDA. The driving circuit GDC is arranged on the non-display area DP-NDA. According to some embodiments, the driving circuit GDC may include a scan driving circuit. The scan driving circuit generates a plurality of scan signals (hereinafter, referred to as scan signals) to sequentially output the scan signals to a plurality of scan lines GL (hereinafter, referred to as scan lines) that will be described later. The scan driving circuit may further output another control signal to the driving circuit of the pixels PX.

The scan driving unit may include a plurality of thin film transistors that are manufactured through the same process as the driving circuit of the pixel PX, e.g., a low temperature polycrystalline silicon (LTPS) process or a low temperature polycrystalline oxide (LTPO) process.

The signal lines SGL include scan lines GL, data lines DL, a power line PL, and a control signal line CSL. The signal lines SGL may further include separate reset lines and emission lines. The scan lines GL are respectively connected to corresponding pixels of the pixels PX, and the data lines DL are respectively connected to corresponding pixels PX of the pixels PX. The power line PL is connected to the pixels PX. The control signal line CSL may provide control signals to the scan driving circuit.

The signal lines SGL may be connected to a circuit board. The signal lines SGL may be connected to a timing control circuit mounted on the circuit board and having the form of an integrated chip.

As illustrated in FIG. 5C, three types of pixels may be arranged on each of the first display area DP-A1 and the second display area DP-A2. The three types of pixels that generate light having different colors may be defined as a first color pixel, a second color pixel, and a third color pixel. Each of the three types of pixels may include a pixel driving circuit and a light emitting element.

FIG. 5C illustrates emission areas L-R, L-G, and L-B of light emitting elements. The first emission area L-R is an emission area of a first color pixel, the second emission area L-G is an emission area of a second color pixel, and the third emission area L-B is an emission area of a third color pixel.

The first display area DP-A1 includes a plurality of unit pixel areas UA (defined as a first unit pixel area). The plurality of unit pixel areas UA may have an arrangement of the same emission area. The plurality of unit pixel areas UA includes a first emission area L-R, a second emission area L-G, and a third emission area L-B. According to some embodiments, each of the plurality of unit pixel areas UA includes one first emission area L-R, two second emission areas L-G, and one third emission area L-B. The two second emission areas LG may be arranged to face each other in the first direction DR1, and the first emission area LR and the third emission area LB may be arranged to face each other in the second direction DR2.

One of the two second emission areas L-G may be defined as a fourth emission area that is distinguished from the second emission area. As illustrated in FIG. 5C, the second and fourth emission areas may have different planar shapes. The number and type of emission areas included in the plurality of unit pixel areas UA are not particularly limited.

According to some embodiments, one first emission area L-R may generate red light. Each of the two second emission areas L-G may generate green light. One third emission area L-B may generate blue light. The red light, the green light, and the blue light may be changed to another three primary color light.

A plurality of unit pixel areas UA (defined as a second unit pixel area) may also be arranged on the second display area DP-A2. However, the number of emission areas per unit area SA on the second display area DP-A2 is less than he number of emission areas per unit area SA on the first display area DP-A1. As illustrated in FIG. 5C, the number of unit pixel areas UA per unit area SA on the second display area DP-A2 may be less than the number of unit pixel areas UA per unit area SA on the first display area DP-A1. The pixel density may be inferred by comparing the number of emission areas or the number of unit pixel areas.

According to some embodiments of the inventive concept, a repetition unit of the pixel on the first display area DP-A1 may be different from that on the second display area DP-A2. In other words, the unit pixel areas of the second display area DP-A2 may have an arrangement different from that of the unit pixel areas of the first display area DP-A1.

As illustrated in FIG. 5C, a plurality of non-unit pixel areas UA-D may be arranged on the second display area DP-A2. The pixels are not arranged on the non-unit pixel areas UA-D. At least a light emitting element is not arranged on the non-unit pixel areas UA-D. An optical signal may substantially move through the non-unit pixel areas UA-D.

Each of the non-unit pixel areas UA-D may have a surface area corresponding to that of the unit pixel area UA. The non-unit pixel area UA-D does not necessarily have the same area as the unit pixel area UA. When the unit pixel area UA includes at least three emission areas L-R, L-G, and L-B as described above, the non-unit pixel area UA-D may have a surface area greater than the sum of surface areas of at least two emission areas of at least three emission areas L-R, L-G, and L-B.

FIG. 5D illustrates a cross-sectional view of the display panel DP corresponding to the first emission area L-R among the emission areas L-R, L-G, and L-B. FIG. 5D illustrates a cross-sectional view of one transistor TR1 constituting the pixel driving circuit and an organic light emitting diode OLED corresponding to the light emitting element.

The transistor TR1 and the organic light emitting diode OLED are arranged on the base layer BL. The base layer BL may include a synthetic resin layer. A circuit element layer DP-CL is arranged on the base layer BL.

According to some embodiments, the circuit element layer DP-CL may include a buffer layer BFL, a first intermediate inorganic layer L10, a second intermediate inorganic layer L20, and a third intermediate inorganic layer L30, which are inorganic layers, and a first intermediate organic layer L40 and a second intermediate organic layer L50, which are organic layers.

The semiconductor pattern is arranged on the buffer layer BFL. The semiconductor pattern may include a silicon semiconductor. A first semiconductor pattern may include polysilicon. However, the embodiments of the inventive concept are not limited thereto, and the first semiconductor pattern may include amorphous silicon. The semiconductor pattern may include a metal oxide semiconductor.

The semiconductor pattern has different electrical properties depending on whether the semiconductor pattern is doped. The semiconductor pattern may include a doped region and a non-doped region. The doped region may be doped with an N-type dopant or a P-type dopant. A P-type transistor includes a doped region into which the P-type dopant is doped.

The doped region may have conductivity greater than that of the non-doped region and substantially act as an electrode or a signal line. The non-doped region may substantially correspond to an active (or a channel) of the transistor. In other words, a portion of the semiconductor pattern may be an active (or a channel) of the transistor, another portion may be a source (or input electrode area) or a drain (output electrode area) of the transistor, and another portion may be a connection signal line (or a connection electrode).

As illustrated in FIG. 5D, a source S1, an active A1, and a drain D1 of the transistor TR1 are formed from a semiconductor pattern. FIG. 3 illustrates a portion of a connection signal line SCL formed from the semiconductor pattern. According to some embodiments, the connection signal line SCL may be connected to another transistor (e.g., a driving transistor) constituting the pixel driving circuit on a plane.

A control electrode (or gate electrode) G1 is arranged on the first intermediate inorganic layer L10 to overlap the active A1. A first capacitor electrode CPE1 of the capacitor CP is arranged on the first intermediate inorganic layer L10. A second capacitor electrode CPE2 of the capacitor CP is arranged on the second intermediate inorganic layer L20. An upper electrode UE overlapping the control electrode G1 is arranged on the second intermediate inorganic layer L20.

A first connection electrode CNE1 may be arranged on the third intermediate inorganic layer L30. A first connection electrode CNE1 may be connected to the connection signal line SCL through a first through-hole CH1. A second connection electrode CNE2 may be arranged on the first intermediate organic layer L40. The second connection electrode CNE2 may be connected to the first connection electrode CNE1 through a second through-hole CH2. According to some embodiments, conductive patterns different from the first connection electrode CNE1 may be arranged on the third intermediate inorganic layer L30, and conductive patterns different from the second connection electrode CNE2 may be arranged on the first intermediate organic layer L40. These conductive patterns may constitute a signal line, for example, a data line DL (see FIG. 5B).

The first electrode AE is arranged on the second intermediate organic layer L50. The first electrode AE may be connected to the second connection electrode CNE2 through a third through-hole CH3. An emission opening OP is defined in a pixel defining layer PDL. The emission opening OP of the pixel defining layer PDL exposes at least a portion of the first electrode AE.

The display area DP-DA may include an emission area L-R and a non-emission area N-L adjacent to the emission area L-R. The non-emission area N-L may surround the emission area L-R. According to some embodiments, the emission area L-R is defined to correspond to a partial area of the first electrode AE exposed by the emission opening OP.

The hole control layer HCL may be commonly arranged on the emission area L-R and the non-emission area N-L. The hole control layer HCL may include a hole transport layer and may further include a hole injection layer. The emission layer EML is arranged on the hole control layer HCL. The emission layer EML may be arranged on an area corresponding to the emission opening OP. That is, the light emitting layer EML may be formed to be separated from each of the pixels PX. Also, the emission layer EML may include an organic material and/or an inorganic material. The emission layer EML may generate light having a color (e.g., a set or predetermined color).

An electronic control layer ECL is arranged on the emission layer EML. The electron control layer ECL may include an electron transport layer and may further include an electron injection layer. The hole control layer HCL and the electron control layer ECL may be commonly formed in the plurality of pixels by using an open mask. The second electrode CE is arranged on the electron control layer ECL. The second electrode CE is commonly arranged on the plurality of pixels. An upper insulating layer TFL is arranged on the second electrode CE. The upper insulating layer TFL may include a plurality of thin films. The plurality of thin films may include an organic layer and/or an inorganic layer.

FIG. 5E illustrates a cross-sectional view of the display panel DP corresponding to the non-unit pixel area UA-D. Unlike the cross section corresponding to the first emission area L-R, semiconductor patterns and conductive patterns are not arranged on the non-unit pixel area UA-D, and only an insulating layer is arranged on the non-unit pixel area UA-D. The semiconductor patterns and the conductive patterns are excluded from the non-unit pixel area UA-D because of interfering with the transmission of the optical signal.

As shown by the dotted line in FIG. 5E, an opening L-OP may be defined in the non-unit pixel area UA-D of some of the insulating layers L40 and L50. The pixel defining layer PDL and the upper insulating layer TFL are filled in the opening L-OP, and the corresponding area in the non-unit pixel area UA-D has an insulating layer thickness less than that of each of other areas. The thickness of the insulating layer corresponding to the non-unit pixel area UA-D may be reduced to improve the transmittance of the optical signal.

Unlike that illustrated in FIG. 5E, the entire organic light emitting diode OLED or only a portion of the organic light emitting diode OLED may not be arranged on the non-unit pixel area UA-D when comparing the cross-section corresponding to the first emission area L-R. For example, the first electrode AE of the organic light emitting diode OLED may not be formed.

Figure 6:
FIG. 6 is a graph illustrating optical characteristics of a protective layer according to some embodiments.
Figure 6:
Figure 6:
Figure 6:

FIG. 6 is a graph illustrating optical characteristics of the protective layer. In FIG. 6, optical characteristics of a protective layer according to a comparative example and the protective layer PPL (see FIG. 4) according to some embodiments of the inventive concept were measured.

In a first comparative example #1, a protective layer PPL having the form of a synthetic resin film was applied, and in a second comparative example #5, a protective layer having the form of a synthetic resin layer PPL was applied. In a first embodiment #2, a protective layer having the form of a synthetic resin film was applied, and in a second embodiment #3 and in the third embodiment #4, a protective layer having the form of a synthetic resin layer was applied. The protective layer having the form of the synthetic resin film is separately prepared and then attached to the bottom surface of the display panel DP by an adhesive layer AL4, and the protective layer having the form of the synthetic resin layer is subject to a polymerization reaction on the bottom surface of the display panel DP through a curing process after applying a synthetic resin composition on the bottom surface of the display panel DP.

In FIG. 6, transmittance, haze, and wavefront of the synthetic resin film or the synthetic resin layer were measured by the synthetic resin film or the synthetic resin layer alone, and a modulation transfer function value was measured in a state in which the camera module CM is arranged under the display device DD as illustrated in FIG. 4. In FIG. 6, the modulation transfer function value was measured at a frequency of about 110 LP/mm.

The modulation transfer function value is used as a measure for evaluating lens performance and indicates whether contrast of a subject is capable of being sufficiently reproduced in terms of spatial frequency characteristics. The camera module CM has its own modulation transfer function value.

When an image of the subject is photographed through incident light (reflected light from the subject) passing through an intermediate member in a state in which the intermediate member is arranged between the subject and the camera module CM, a modulation transfer function value of the image is inevitably lowered.

The modulation transfer function value of the photographed image may be determined by the optical characteristics of the intermediate member. In the display device DD described with reference to FIG. 4, the upper member UM, the display panel DP, and the protective layer PPL correspond to the intermediate members.

In the display device DD illustrated in FIG. 4, a modulation transfer function value of an image photographed by the camera module CM may be about 60% or more at a frequency of about 110 LP/mm. According to some embodiments, the modulation transfer function value of the image photographed by the camera module CM may be about 100%. However, because the light reflected from the subject is diffracted while passing the upper member UM, the display panel DP, and the protective layer PPL, the modulation transfer function value may be less than about 100%. The modulation transfer function value of the image photographed by the camera module CM may be about 70% or more at a frequency of about 110 LP/mm.

The optical characteristics of the synthetic resin film may vary depending on a composition ratio of a monomer, an oligomer, and an additive. The optical characteristics of the synthetic resin layer may be determined by a leveling time, a light curing time, a type of light source, and an intensity of a light source of the synthetic resin composition. Uniformity in the materials of the synthetic resin film and the synthetic resin layer, and roughness of a surface may commonly affect the modulation transfer function value of the image photographed by the camera module CM.

The modulation transfer function value is highly related to straightness of light, and the haze (or light dispersion) and wavefront (or light distortion characteristics) of each of the synthetic resin film and the synthetic resin layer may be main factors determining the modulation transfer function value.

The synthetic resin film and the synthetic resin layer according to some embodiments of the inventive concept have the following optical characteristics so as to increase in modulation transfer function value of the image photographed by the camera module CM. In each of the synthetic resin film and the synthetic resin layer, a haze may be about 4% or less, a wavefront peak valley value may be about 0.05 or more and about 2.00 or less, and a wavefront root mean square value may be about 0.01 or more and about 0.40 or less.

When comparing the first comparative example #1 to the first embodiment #2, it is seen that even if the transmittance is high, the modulation transfer function value is low. This is done because the wavefront root mean square value in the first comparative example #1 is relatively high.

In the second embodiment #3 compared to the first embodiment #1, the wavefront peak valley value (wavefront [PV]: wavefront peak valley value) is high, and the wavefront root mean square value (wavefront [RMS]: wavefront root mean square value) is higher, but the haze is low. It is seen that even if the wavefront characteristic is large, a low haze may cause an increase in modulation transfer function value.

In the third embodiment #4 compared to the second embodiment #3, the haze is low, the wavefront peak valley value is low, and the wavefront root mean square value is lower. As a result, in the third embodiment #4 compared to the second embodiment #3, a higher modulation transfer function value is obtained.

When comparing the first embodiment #2, the second embodiment #3, and the third embodiment #4, it is seen that the synthetic resin layer has a haze less than that of the synthetic resin film, but this is not necessary, the haze is higher, like the second embodiment #5. The synthetic resin layer may have a wavefront value greater than that of the synthetic resin film. In conclusion, it is seen that the haze and wavefront characteristics of the synthetic resin layer are determined by the above-described preparing conditions of the synthetic resin layer.

Figure 7:
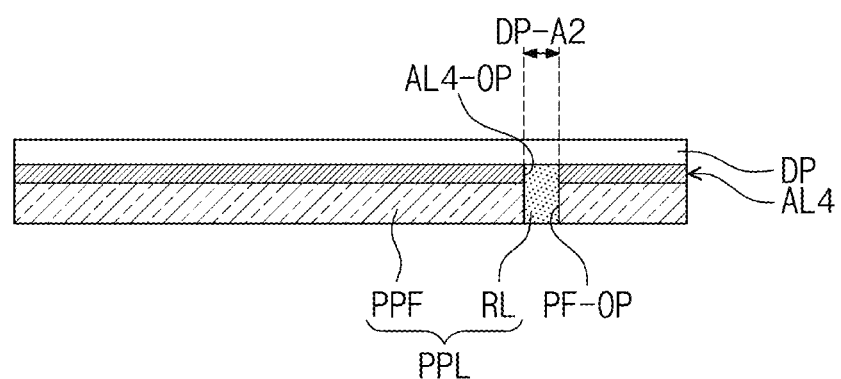
FIG. 7 is a partial cross-sectional view of the electronic device according to some embodiments of the inventive concept.

FIG. 7 is a partial cross-sectional view of the electronic device according to some embodiments of the inventive concept. FIG. 7 illustrates only a cross-sectional view of the display panel DP, the fourth adhesive layer AL4, and the protective layer PPL when compared to FIG. 4. Hereinafter, detailed descriptions of the constituents described with reference to FIGS. 1 to 7 may be omitted.

The protective layer PPL includes a synthetic resin film PPF having a second opening PPF-OP corresponding to the second display area DP-A2 and a synthetic resin layer RL arranged inside the second opening PPF-OP. A third opening AL4-OP corresponding to the second display area DP-A2 may also be defined in the fourth adhesive layer AL4. Thus, the synthetic resin layer RL may be in contact with the bottom surface of the display panel DP. The third opening AL4-OP may be defined to correspond to the second opening PPF-OP. The third opening AL4-OP may be aligned with the second opening PPF-OP.

The synthetic resin layer RL may be prepared to have a haze and wavefront that are less than those of the synthetic resin film PPF. The synthetic resin layer RL may substantially correspond to the second embodiment #2 and the third embodiment #3 described in FIG. 6.

In the synthetic resin film PPF non-overlapping the second display area DP-A2, protective characteristics are more important than the haze or wavefront characteristics. Thus, the synthetic resin film PPF may have an elastic modulus greater than that of the synthetic resin layer RL.

The protective layer PPL according to some embodiments may satisfy both the protective characteristics that are suitable for the display panel DP and the optical characteristics that are suitable for the camera module CM.

Figure 8A:
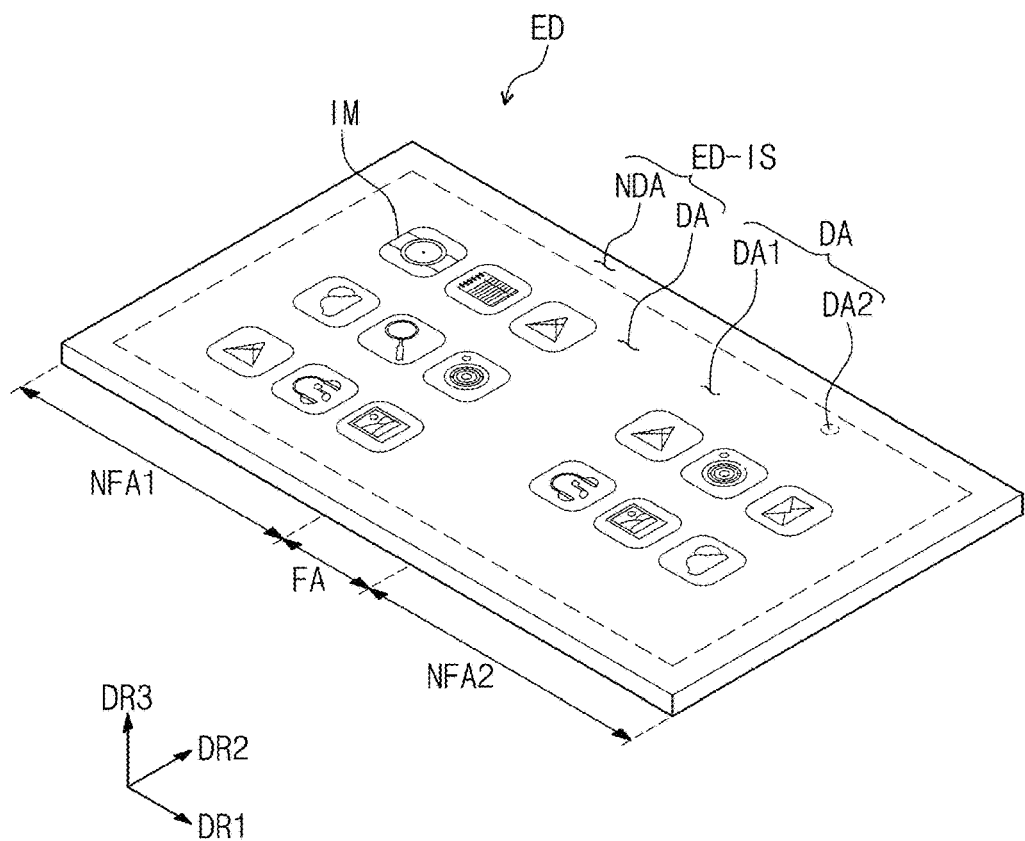
FIGS. 8A and 8B are perspective views of a display device according to some embodiments of the inventive concept.
Figure 8B:
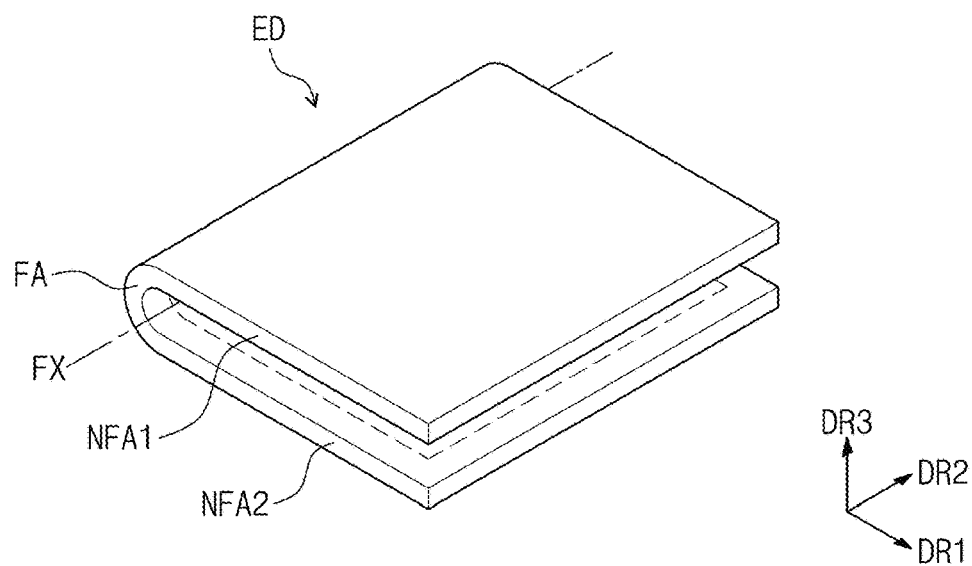
Figure 8C:
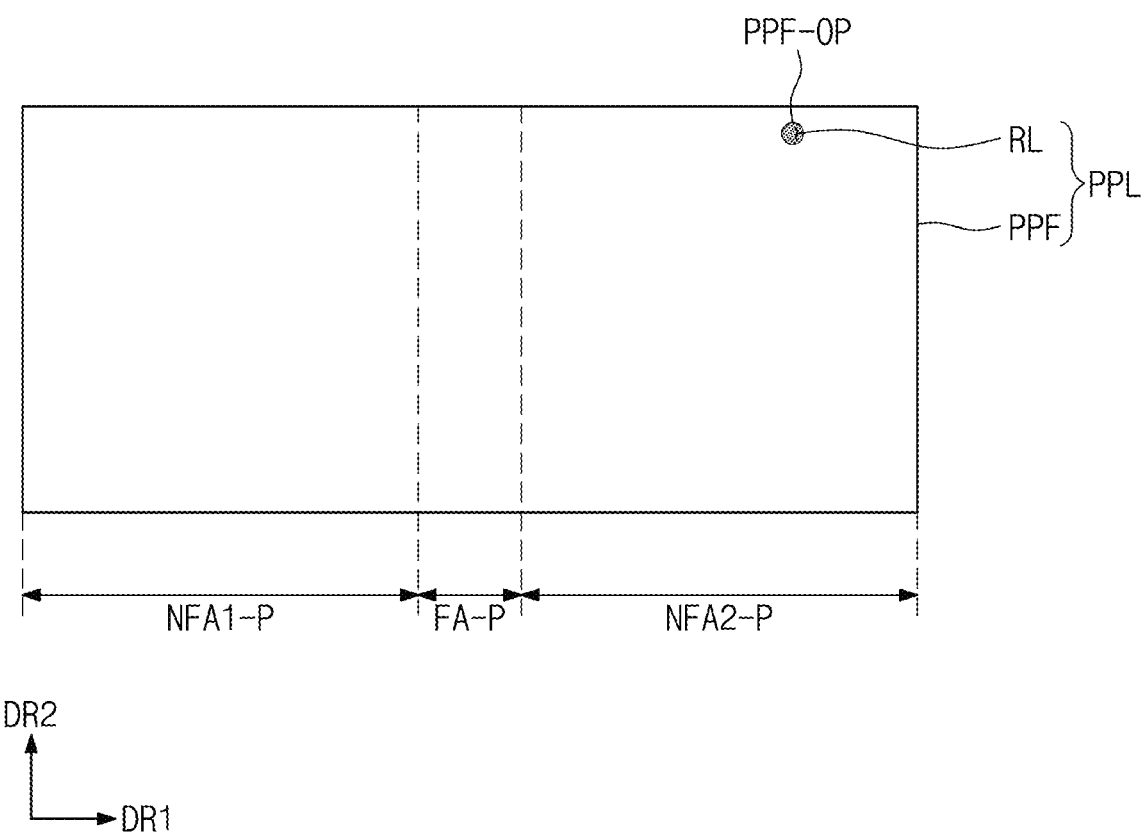
FIG. 8C is a plan view of a protective layer applied to the display device of FIGS. 8A and 8B according to some embodiments.
Figure 9A:
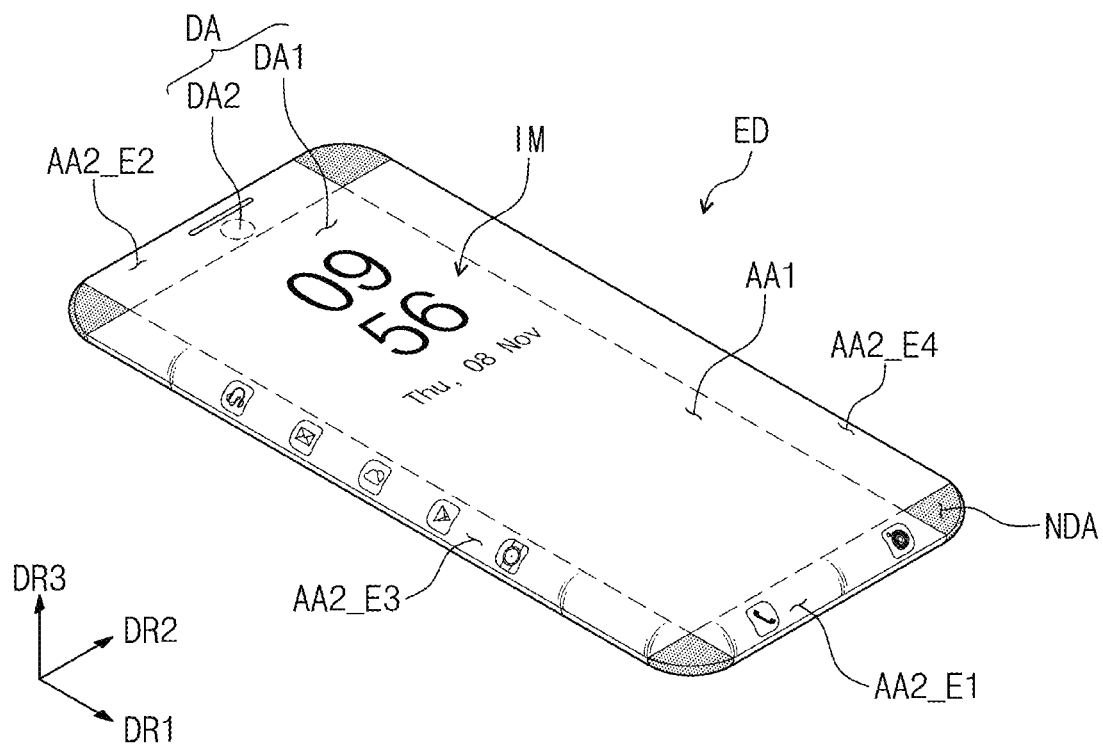
FIG. 9A is a perspective view of a display device according to some embodiments of the inventive concept.
Figure 9B:
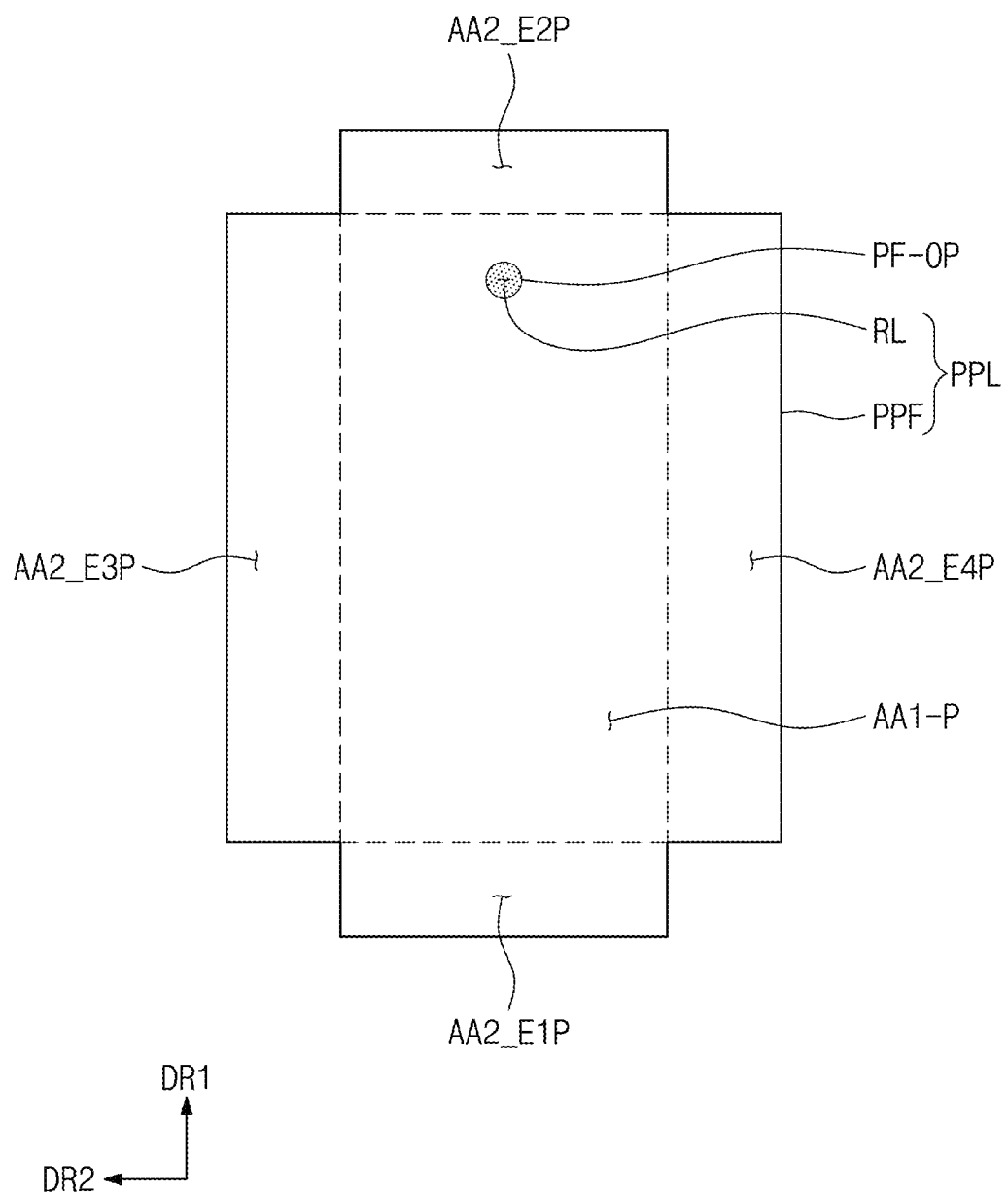
FIG. 9B is a plan view of a protective layer applied to the display device of FIG. 9A according to some embodiments.
Figure 10A:
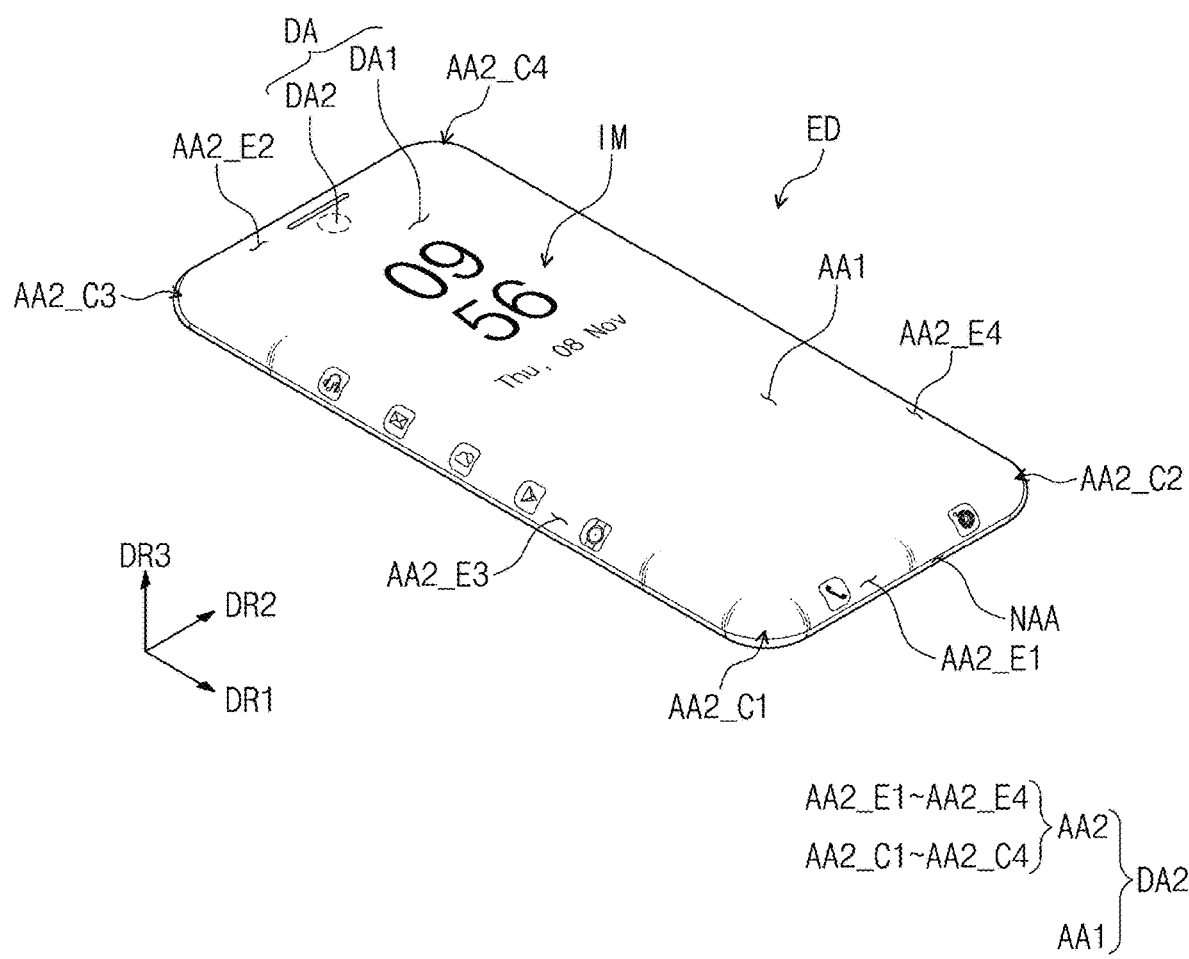
FIG. 10A is a perspective view of a display device according to some embodiments of the inventive concept.
Figure 10B:
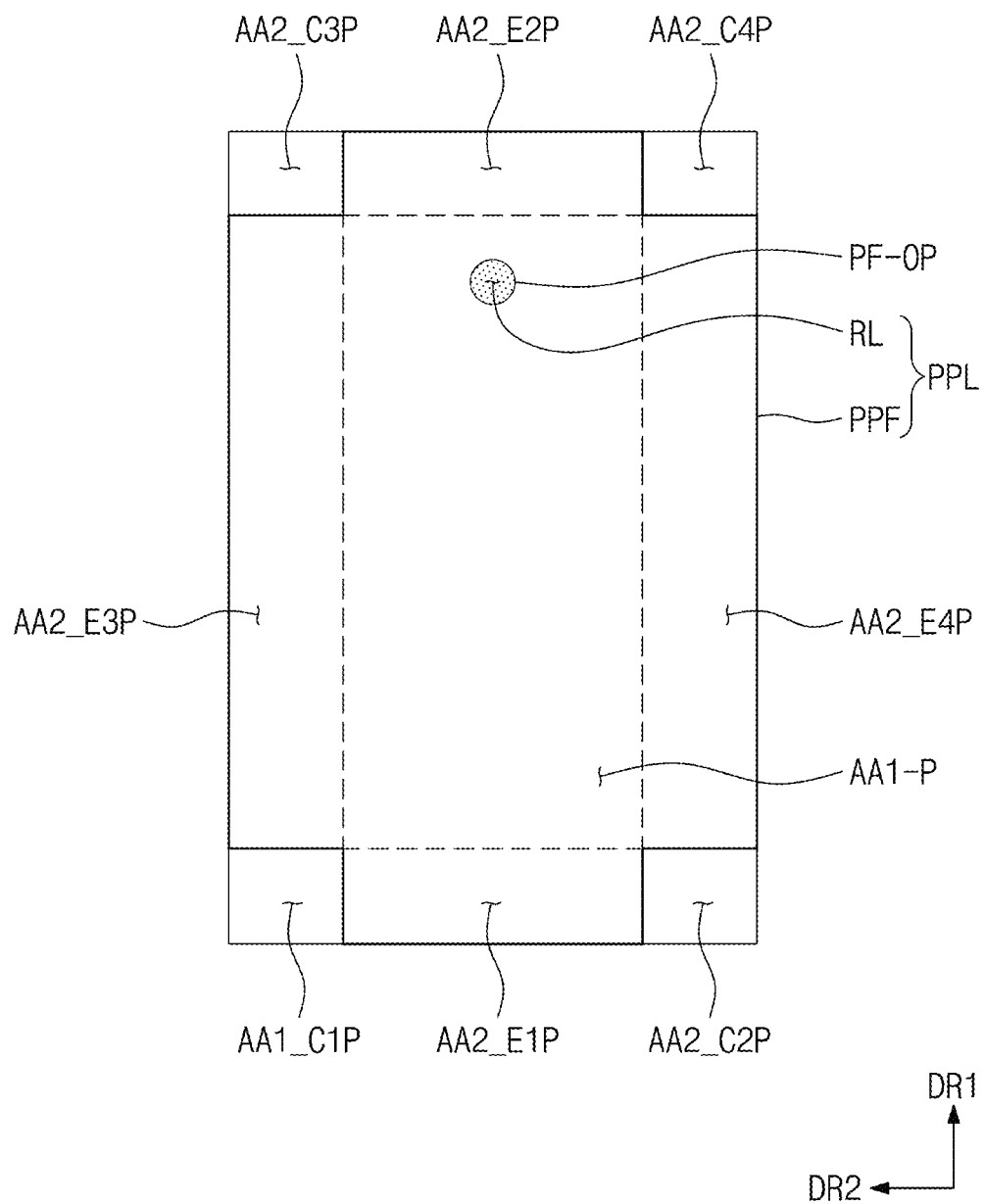
FIG. 10B is a plan view of a protective layer applied to the display device of FIG. 10A according to some embodiments.

FIGS. 8A and 8B are perspective views of a display device DD according to some embodiments of the inventive concept. FIG. 8C is a plan view of a protective layer PPL applied to the display device of FIGS. 8A and 8B. FIG. 9A is a perspective view of a display device DD according to some embodiments of the inventive concept. FIG. 9B is a plan view of a protective layer PPL applied to the display device of FIG. 9A. FIG. 10A is a perspective view of a display device DD according to some embodiments of the inventive concept. FIG. 10B is a plan view of a protective layer PPL applied to the display device of FIG. 10A.

In FIGS. 8A to 10B, a protective layer PPL having the type illustrated in FIG. 7 is illustrated as an example. A detailed description of the relationship between the synthetic resin layer RL and the synthetic resin film PPF described in FIG. 7 may be omitted. According to some embodiments of the inventive concept, an integral protective layer PPL may be provided. The integral protective layer PPL may be in the form of a synthetic resin film or a synthetic resin layer.

Referring to FIGS. 8A and 8B, the display device DD may include a folding area FA, a first non-folding area NFA1, and a second non-folding area NFA2. In the first direction DR1, the folding area FA may be arranged between the first non-folding area NFA1 and the second non-folding area NFA2.

The folding area FA may be folded based on a folding axis FX parallel to the second direction DR2. According to some embodiments, the folding axis FX parallel to a short axis is illustrated as an example, but the folding axis FX may be designed to be parallel to a long axis.

The folding area FA has a curvature (e.g., a set or predetermined curvature) and a curvature radius. The display device DD may be inner-folded so that the first non-folding area NFA1 and the second non-folding area NFA2 face each other, and the display surface DS is not exposed to the outside.

According to some embodiments of the inventive concept, the display device DD may be out-folded so that the display surface DS is exposed to the outside. According to some embodiments of the inventive concept, the display device DD may be configured to repeatedly perform an in-folding operation or an out-folding operation from an unfolding operation. According to some embodiments of the inventive concept, the display device DD may be configured to repeatedly perform the unfolding operation and the in-folding operation, or repeatedly perform the unfolding operation and the out-folding operation.

Referring to FIG. 8C, the protective layer PPL may include a synthetic resin film PPF having a folding area FA-P, a first non-folding area NFA1-P, and a second non-folding area NFA2-P, which respectively correspond to the folding area FA, the first non-folding area NFA1, and the second non-folding area NFA2. The folding area FA-P may have a thickness less than that of each of the first non-folding area NFA1-P and the second non-folding area NFA2-P or may have a low elastic modulus.

Referring to FIG. 9A, the display device DD may include a planar display area AA1 and side display areas AA2_E1 to AA2_E4. Each of the side display areas AA2_E1 to AA2_E4 is bent from the planar display area AA1.

Referring to FIG. 9B, the protective layer PPL may include a synthetic resin film PPF having a planar area AA1P and side areas AA2_E1P to AA2_E4P, which respectively correspond to the planar display area AA1 and the side display areas AA2_E1 to AA2_E4. Each of the side areas AA2_E1P to AA2_E4P may have a thickness less than that of the planar area AA1P or may have a low elastic modulus.

According to FIG. 10A, the display device DD may further include corner display areas AA2_C1 to AA2_C4 when compared to the display device DD illustrated in FIG. 9A. Each of the corner display areas AA2_C1 to AA2_C4 is stretched from the planar display area AA1 and the side display areas AA2_E1 to AA2_E4, respectively. The corner display areas AA2_C1 to AA2_C4 are attached to corner areas of the window having a multi-curvature in the stretched state.

Referring to FIG. 10B, the protective layer PPL may include a synthetic resin film PPF having corner areas AA2_C1P to AA2_C4P corresponding to the corner display areas AA2_C1 to AA2_C4. Each of the corner areas AA2_C1P to AA2_C4P may have a thickness less than that of each of the planar area AA1P and the side areas AA2_E1P to AA2_E4P or may have a low elastic modulus. A plurality of openings may be defined in the corner areas AA2_C1P to AA2_C4P, and patterns having an auxetic shape may be arranged.

As described above, an optical signal may move through the display area. The area through which the optical signal moves may not be recognized or perceived as a non-display area by the user. Because the physical optical signal transmission hole is not applied to the display panel, the user may not recognize or perceive the area through which the optical signal moves through the outer appearance of the display device.

The quality of the image photographed by the camera module may be relatively improved. Thus, a relatively more clear image may be photographed.

It will be apparent to those skilled in the art that various modifications and deviations can be made in the inventive concept. Thus, it is intended that the present disclosure covers the modifications and deviations of this invention provided they come within the scope of the appended claims and their equivalents.

Accordingly, the technical scope of the inventive concept should not be limited to the contents described in the detailed description of the specification, but should be determined by the claims, and their equivalents.

What is claimed is:

1. A display device comprising:
   a window;
   a display panel comprising a first display area and a second display area having a pixel density less than that of the first display area, the display panel being under the window;
   a protective layer under the display panel; and
   a lower layer in which a first opening corresponding to the second display area is defined and which is under the protective layer,
   wherein a portion of the protective layer, which corresponds to the second display area, has a haze of 4% or less, a wavefront peak valley value of 0.05 or more and 2.00 or less, a wavefront root mean square value of 0.01 or more and 0.40 or less.

2. The display device of claim 1, wherein the protective layer comprises a synthetic resin film and an adhesive layer between the synthetic resin film and the display panel.

3. The display device of claim 2, wherein the synthetic resin film overlaps the first display area and the second display area.

4. The display device of claim 1, wherein the protective layer comprises a synthetic resin layer that is directly on a bottom surface of the display panel.

5. The display device of claim 4, wherein the synthetic resin layer overlaps the first display area and the second display area.

6. The display device of claim 1, wherein the protective layer comprises:
   a synthetic resin film having a second opening corresponding to the second display area; and
   a synthetic resin layer inside the second opening.

7. The display device of claim 1, wherein the protective layer comprises at least one of polyethylene terephthalate, polyurethane, or polyethylene.

8. The display device of claim 1, wherein a light emitting element on the first display area has a density greater than that on the second display area.

9. The display device of claim 1, wherein the lower layer comprises a metal plate.

10. The display device of claim 1, wherein the first display area comprises a plurality of first unit pixel areas,
    the second display area comprises a plurality of second unit pixel areas and a plurality of non-unit pixel areas,
    the plurality of second unit pixel areas comprise an insulating layer overlapping the second display area and a light emitting element on the insulating layer, and
    each of the plurality of non-unit pixel areas comprises an opening defined in the insulating layer.

11. The display device of claim 10, wherein each of the plurality of first unit pixel areas and the plurality of second unit pixel areas comprises at least three emission areas, and
    each of the non-unit pixel areas has a surface area greater than a sum of surface areas of at least two emission areas of the three emission areas.

12. The display device of claim 1, wherein a modulation transfer function value of an image of a subject outside the window, which is photographed by a camera module that is under the lower layer to correspond to the first opening is 60% or more.

13. A display device comprising:
    a window;
    a display panel comprising a first display area and a second display area having a pixel density less than that of the first display area, the display panel being under the window;
    a protective layer under the display panel; and
    a lower layer in which a first opening corresponding to the second display area is defined and which is under the protective layer,
    wherein the protective layer comprises:
      a synthetic resin film corresponding to the first display area and in which a second opening corresponding to the second display area is defined; and
      a synthetic resin layer inside the second opening,
      wherein the synthetic resin layer has an elastic modulus less than that of the synthetic resin film, and
      the synthetic resin layer has a haze less than that of the synthetic resin film,
    wherein the synthetic resin layer has a wavefront peak valley value of 0.05 or more and 2.00 or less.

14. The display device of claim 13, wherein the synthetic resin layer has a haze of 4% or less.

15. The display device of claim 13, wherein the synthetic resin layer has a wavefront root mean square value of 0.01 or more and 0.40 or less.

16. The display device of claim 13, wherein a modulation transfer function value of an image of a subject outside the window, which is photographed by a camera module that is under the lower layer to correspond to the first opening is 60% or more.

17. The display device of claim 13, wherein an adhesive layer is between the synthetic resin film and a bottom surface of the display panel, and
    the synthetic resin layer is directly on the bottom surface of the display panel.

18. The display device of claim 17, wherein a third opening corresponding to the second opening is in the adhesive layer.

19. An electronic device comprising:
    a display device comprising a first display area and a second display area having a pixel density less than that of the first display area;
    a camera module under the display device to correspond to the second display area; and
    a housing coupled to the display device to accommodate the camera module,
    wherein a modulation transfer function value of an image of a subject outside the display device, which is photographed by the camera module is 60% or more at a frequency of 110 LP/mm, and
    a protective layer in a path along which light reflected from the subject is incident into the camera module has a haze of 4% or less and a wavefront peak valley value of 0.05 or more and 2.00 or less.

* * * * *